(12) United States Patent
Yang et al.

(10) Patent No.: US 11,287,918 B2
(45) Date of Patent: Mar. 29, 2022

(54) PRESSURE SENSING DEVICE, DISPLAY PANEL AND METHOD OF MANUFACTURING THE SAME, DISPLAY DEVICE

(71) Applicant: BOE TECHNOLOGY GROUP CO., LTD., Beijing (CN)

(72) Inventors: Shengji Yang, Beijing (CN); Xiaochuan Chen, Beijing (CN); Hui Wang, Beijing (CN); Kuanta Huang, Beijing (CN); Pengcheng Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 5 days.

(21) Appl. No.: 16/912,340

(22) Filed: Jun. 25, 2020

(65) Prior Publication Data
US 2020/0411600 A1 Dec. 31, 2020

(30) Foreign Application Priority Data

Jun. 28, 2019 (CN) .......................... 201910575872.3

(51) Int. Cl.
*G06F 3/044* (2006.01)
*G09G 3/32* (2016.01)
(Continued)

(52) U.S. Cl.
CPC .......... *G06F 3/0414* (2013.01); *G06F 3/0445* (2019.05); *G06F 3/04144* (2019.05);
(Continued)

(58) Field of Classification Search
CPC .. G06F 3/0414; G06F 3/0445; G06F 3/04144; G06F 3/04166; G06F 3/0412;
(Continued)

(56) References Cited

U.S. PATENT DOCUMENTS 5,861,704 A * 1/1999 Kitami .................. H01L 41/107
310/369
5,942,733 A * 8/1999 Allen ..................... G06F 3/0445
178/18.01

(Continued)

*Primary Examiner* — Julie Anne Watko
(74) *Attorney, Agent, or Firm* — Procopio, Cory, Hargreaves & Savitch LLP

(57) ABSTRACT

A pressure sensing device, a display panel and a method of manufacturing the same, and a display device are provided. The pressure sensing device includes a columnar electrode assembly having at least one columnar electrode and at least one columnar insulating layer that are alternately stacked in an axial direction of a columnar electrode, and an annular electrode assembly that is disposed around the columnar electrode assembly. The annular electrode assembly includes at least one annular electrode and at least one annular insulating layer that are alternately stacked in the axial direction of the columnar electrode. The annular electrode assembly and the columnar electrode assembly are insulated from each other, and are configured to form a capacitor. At least one of the at least one annular insulating layer and the at least one columnar insulating layer is an elastic insulating layer.

18 Claims, 11 Drawing Sheets

(51) Int. Cl.
*G09G 3/3233* (2016.01)
*H01L 27/32* (2006.01)
*G06F 3/041* (2006.01)
*H01L 51/00* (2006.01)
*H01L 51/56* (2006.01)

(52) U.S. Cl.
CPC ............. *G09G 3/32* (2013.01); *H01L 27/323* (2013.01); *G06F 3/0412* (2013.01); *G06F 3/04166* (2019.05); *G06F 2203/04102* (2013.01); *G06F 2203/04103* (2013.01); *G06F 2203/04105* (2013.01); *G09G 3/3233* (2013.01); *G09G 2300/0426* (2013.01); *G09G 2300/0814* (2013.01); *G09G 2300/0819* (2013.01); *G09G 2300/0852* (2013.01); *G09G 2300/0861* (2013.01); *G09G 2310/08* (2013.01); *G09G 2320/045* (2013.01); *G09G 2354/00* (2013.01); *H01L 51/0097* (2013.01); *H01L 51/56* (2013.01); *H01L 2251/5338* (2013.01)

(58) Field of Classification Search
CPC . G06F 2203/04102; G06F 2203/04103; G06F 2203/04105; G09G 3/32; G09G 3/3233; G09G 2300/0426; G09G 2300/0814; G09G 2300/0819; G09G 2300/0852; G09G 2300/0861; G09G 2310/08; G09G 2320/045; G09G 2354/00; H01L 27/323; H01L 51/0097; H01L 51/56; H01L 2251/5338

See application file for complete search history.

(56) References Cited

U.S. PATENT DOCUMENTS

| | | | | |
|---|---|---|---|---|
| 6,002,389 | A * | 12/1999 | Kasser | G06F 3/0445 345/173 |
| 10,672,946 | B2 * | 6/2020 | Cho | H05K 1/11 |
| 10,976,854 | B2 * | 4/2021 | Guo | G06F 3/0414 |
| 2005/0057528 | A1 * | 3/2005 | Kleen | G06F 3/016 345/173 |
| 2007/0257821 | A1 * | 11/2007 | Son | G06F 3/0446 341/22 |
| 2014/0238152 | A1 * | 8/2014 | Kallassi | G06F 3/0446 73/862.626 |
| 2015/0130742 | A1 * | 5/2015 | Chen | G06F 3/0445 345/174 |
| 2015/0277626 | A1 * | 10/2015 | Shinkai | G06F 3/0446 345/174 |
| 2016/0202760 | A1 * | 7/2016 | Churikov | A63F 13/285 345/173 |
| 2017/0205930 | A1 * | 7/2017 | Lee | G06F 3/0416 |
| 2017/0228065 | A1 * | 8/2017 | Lee | G06F 3/0445 |
| 2017/0269773 | A1 * | 9/2017 | Suzuki | G06F 3/04166 |
| 2018/0074694 | A1 * | 3/2018 | Lehmann | G06F 3/04883 |

* cited by examiner

PRESSURE SENSING DEVICE, DISPLAY PANEL AND METHOD OF MANUFACTURING THE SAME, DISPLAY DEVICE

CROSS-REFERENCE TO RELATED APPLICATION

This application claims priority to Chinese Patent Application No. 201910575872.3, filed on Jun. 28, 2019, which is incorporated herein by reference in its entirety.

TECHNICAL FIELD

The present disclosure relates to the field of display technologies, and in particular, to a pressure sensing device, a display panel and a method of manufacturing the same, and a display device.

BACKGROUND

With the development of display technologies, touch display devices have been widely used in people's daily lives, bringing great convenience to people's daily lives. In order to increase the human-machine interaction performance of the touch display device, a pressure sensing device can be provided in the touch display device to realize a pressure detection function.

SUMMARY

In one aspect, a pressure sensing device is provided. The pressure sensing device includes: a columnar electrode assembly including at least one columnar electrode and at least one columnar insulating layer that are alternately stacked in an axial direction of a columnar electrode; and an annular electrode assembly disposed around the columnar electrode assembly, the annular electrode assembly including at least one annular electrode and at least one annular insulating layer that are alternately stacked in the axial direction of the columnar electrode. The annular electrode assembly and the columnar electrode assembly are insulated from each other, and being configured to form a capacitor. At least one of the at least one annular insulating layers and the at least one columnar insulating layer is an elastic insulating layer.

In some embodiments, an elastic modulus of a material of the at least one annular insulating layer is less than an elastic modulus of a material of the at least one columnar insulating layer, and in the axial direction of the columnar electrode, a height of the annular electrode assembly is greater than or equal to a height of the columnar electrode assembly; or the elastic modulus of the material of the at least one columnar insulating layer is less than the elastic modulus of the material of the at least one annular insulating layer, and in the axial direction of the columnar electrode, the height of the annular electrode assembly is less than or equal to the height of the columnar electrode assembly.

In some embodiments, the material of the at least one annular insulating layer includes a first elastic insulating material, and the material of the at least one columnar insulating layer includes a second elastic insulating material.

In some embodiments, a number of the at least one annular electrode is the same as a number of the at least one columnar electrode, and a number of the at least one annular insulating layer is the same as a number of the at least one columnar insulating layer.

In some embodiments, the at least one annular electrode includes a plurality of annular electrodes, a number of the plurality of annular electrodes is one more than the number of the at least one annular insulating layer, and each annular insulating layer is disposed between two adjacent annular electrodes; and the at least one columnar electrode includes a plurality of columnar electrodes, a number of the plurality of columnar electrodes is one more than the number of the at least one columnar insulating layer, and each columnar insulating layer is disposed between two adjacent columnar electrodes; or the at least one annular insulating layer includes a plurality of annular insulating layers, a number of the plurality of annular insulating layers is one more than the number of the at least one annular electrode, and each annular electrode is disposed between two adjacent annular insulating layers; and the at least one columnar insulating layer includes a plurality of columnar insulating layers, a number of the plurality of columnar insulating layers is one more than the number of the at least one columnar electrode, and each columnar electrode is disposed between two adjacent columnar insulating layers.

In some embodiments, the at least one annular electrode includes three annular electrodes, and the at least one columnar electrode includes three columnar electrodes.

In some embodiments, the pressure sensing device further includes: a connection portion, wherein the connection portion includes a base, at least one first connection terminal and at least one second connection terminal, the base includes a plurality of via holes extending through the base in a thickness direction of the base, and each first connection terminal and each second connection terminal passes through respective via holes, and protrudes from two surfaces of the base in the thickness direction thereof; at least one first connection wire, wherein each first connection wire electrically connects a corresponding annular electrode to a corresponding first connection terminal; and at least one second connection wire, wherein each second connection wire electrically connects a corresponding columnar electrode to a corresponding second connection terminal.

In some embodiments, the pressure sensing device further includes: an insulating plate; and at least one spring member disposed between the insulating plate and the columnar electrode assembly, wherein an end of each spring member is fixed on the insulating plate, and an opposite end of the spring member is fixed on a side face of the columnar electrode assembly.

In some embodiments, the columnar electrode assembly and the annular electrode assembly are arranged coaxially.

In another aspect, a display panel is provided. The display panel includes: a base substrate; a plurality of light-emitting devices disposed on the base substrate; and a plurality of pressure sensing devices as described above disposed on the base substrate, wherein each pressure sensing device is disposed between two adjacent light-emitting devices.

In some embodiments, the display panel further includes: a plurality of pixel driving circuits disposed on the base substrate, wherein each pixel driving circuit is disposed between the base substrate and a corresponding light-emitting device, and the pixel driving circuit is configured to drive the corresponding light-emitting device to emit light; a plurality of driving signal lines disposed on the base substrate, wherein the plurality of driving signal lines are divided into a plurality of driving signal line groups, each driving signal line group includes at least one driving signal line, each driving signal line group is disposed between the base substrate and a corresponding pressure sensing device, and the driving signal line group is configured to supply a driving signal to the pressure sensing device; and a plurality of sensing signal lines disposed on the base substrate, wherein the plurality of sensing signal lines are divided into a plurality of sensing signal line groups, each sensing signal line group includes at least one sensing signal line, each sensing signal line group is disposed between the base substrate and a corresponding pressure sensing device, and the sensing signal line group is configured to receive a pressure sensing signal from the pressure sensing device.

In some embodiments, the plurality of light-emitting devices includes micro light-emitting diodes. The display panel further includes: a planarization layer disposed between layers where the plurality of pixel driving circuits, the plurality of driving signal lines and the plurality of sensing signal lines are located and layers where the plurality of light-emitting devices and the plurality of pressure sensing devices are located, wherein a plurality of first via holes and a plurality of second via holes are formed in the planarization layer; a plurality of first lead-out structures, wherein the pixel driving circuit includes a plurality of thin film transistors and a supply electrode; each first lead-out structure includes a first conductive pillar and a second conductive pillar, one end of the first conductive pillar is electrically connected to one of the plurality of thin film transistors through a corresponding first via hole, and an opposite end of the first conductive pillar protrudes from a surface of the planarization layer facing away from the plurality of thin film transistors to form a first contact; one end of the second conductive pillar is electrically connected to the supply electrode through another first via hole, and an opposite end of the second conductive pillar protrudes from the surface of the planarization layer facing away from the plurality of thin film transistors to form another first contact; and a plurality of second lead-out structures, wherein each second lead-out structure includes at least one third conductive pillar and at least one fourth conductive pillar, one end of each third conductive pillar is electrically connected to a corresponding driving signal line through a corresponding second via hole, an opposite end of the third conductive pillar protrudes from the surface of the planarization layer facing away from the plurality of thin film transistors to form a second contact; one end of each fourth conductive pillar is electrically connected to a corresponding sensing signal line through another second via hole, and an opposite end of the at least one fourth conductive pillar protrudes from the surface of the planarization layer facing away from the plurality of thin film transistors to form another second contact.

In some embodiments, the display panel further includes: an elastic filling layer disposed at a side of the plurality of light-emitting devices and the plurality of pressure sensing devices away from the base substrate; and a flexible cover plate disposed on a surface of the elastic filling layer facing away from the base substrate.

In some embodiments, the base substrate includes a first flexible substrate layer, a bonding layer, a second flexible substrate layer and a buffer layer that are stacked, and the first flexible substrate layer and the second flexible substrate layer are bonded through the bonding layer. The plurality of light-emitting devices and the plurality of pressure sensing devices are disposed at a side of the buffer layer away from the first flexible substrate layer.

In yet another aspect, a method of manufacturing a display panel is provided. The method includes: providing a base substrate; forming a plurality of light-emitting devices on the base substrate by a micro-transfer printing process, the plurality of light-emitting devices being spaced apart from each other; forming the plurality of pressure sensing devices on the base substrate by the micro-transfer printing process, so that each pressure sensing device is disposed between two adjacent light-emitting devices.

In some embodiments, the method further includes: forming an elastic filling layer and a flexible cover plate sequentially on the base substrate on which the plurality of light-emitting devices and the plurality of pressure sensing devices have been formed.

In some embodiments, before forming the plurality of light-emitting devices and the plurality of pressure sensing devices, the method further includes: forming a plurality of pixel driving circuits, a plurality of driving signal lines and a plurality of sensing signal lines on the base substrate, each pixel driving circuit including a plurality of thin film transistors and a supply electrode; forming a planarization layer having a plurality of first via holes and a plurality of second via holes on the plurality of pixel driving circuits, the plurality of driving signal lines and the plurality of sensing signal lines; forming a plurality of first lead-out structures and a plurality of second lead-out structures on the planarization layer, wherein each first lead-out structure includes a first conductive pillar and a second conductive pillar, one end of the first conductive pillar is electrically connected to one of the plurality of thin film transistors through a corresponding first via hole, and an opposite end of the first conductive pillar protrudes from a surface of the planarization layer facing away from the plurality of thin film transistors to form a first contact; one end of the second conductive pillar is electrically connected to the supply electrode through another first via hole, and an opposite end of the second conductive pillar protrudes from the surface of the planarization layer facing away from the plurality of thin film transistors to form another first contact; and each second lead-out structure includes at least one third conductive pillar and at least one fourth conductive pillar, one end of each third conductive pillar is electrically connected to a corresponding driving signal line through a corresponding second via hole, an opposite end of the third conductive pillar protrudes from the surface of the planarization layer facing away from the plurality of thin film transistors to form a second contact; one end of each fourth conductive pillar is electrically connected to a corresponding sensing signal line through another second via hole, and an opposite end of the fourth conductive pillar protrudes from the surface of the planarization layer facing away from the plurality of thin film transistors to form another second contact.

In yet another aspect, a display device is provided. The display device includes the display panel as described above.

BRIEF DESCRIPTION OF THE DRAWINGS

In order to describe technical solutions in embodiments of the present disclosure more clearly, accompanying drawings to be used in some embodiments of the present disclosure will be introduced briefly. However, the accompanying drawings to be described below are merely accompanying drawings of some embodiments of the present disclosure, and a person of ordinary skill in the art can obtain other drawings according to these drawings. In addition, accompanying drawings in the following description may be regarded as schematic diagrams, and are not limitations on an actual size of a product, an actual process of a method and an actual timing of signals that the embodiments of the present disclosure relate to.

DETAILED DESCRIPTION

Figure 1:
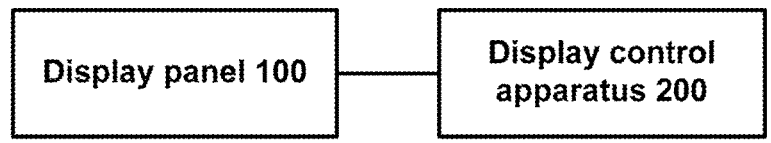
FIG. 1 is a block diagram of a display device, in accordance with some embodiments.

Technical solutions in some embodiments of the present disclosure will be described clearly and completely in combination with accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and claims, the term "comprise/include" and other forms thereof such as the third-person singular form "includes/includes" and the present participle form "includes/including" are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to same embodiment(s) or example(s). In addition, the specific features, structures, materials or characteristics may be included in any or more embodiments or examples in any suitable manner.

It will also be understood that when a layer or element is referred to as being "on" another layer or substrate, it can be directly on the another layer or the substrate, or one or more intervening layers may also be present.

Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Terms such as "first" and "second" are only used for descriptive purposes and are not to be construed as indicating or implying the relative importance or implicitly indicating the number of indicated technical features below. Thus, features defined by the terms "first" and "second" may explicitly or implicitly include one or more of the features. In the description of the embodiments of the present disclosure, the term "a/the plurality of" means two or more unless otherwise specified.

Some embodiments may be described using the expression "coupled" and "connected" along with their derivatives. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled" or "communicatively coupled," however, may also mean that two or more elements are not in direct contact with each other, but yet still co-operate or interact with each other. The embodiments disclosed herein are not necessarily limited in this context.

FIG. 1 illustrates a block diagram showing a structure of a display device according to some embodiments of the present disclosure. The display device may be any product or component with a display function, such as a mobile phone, a tablet computer, a television, a display, a notebook computer, a digital photo frame or a navigator. As shown in FIG. 1, the display device includes a display panel 100 and a display control apparatus 200 connected to the display panel 100.

Figure 2:
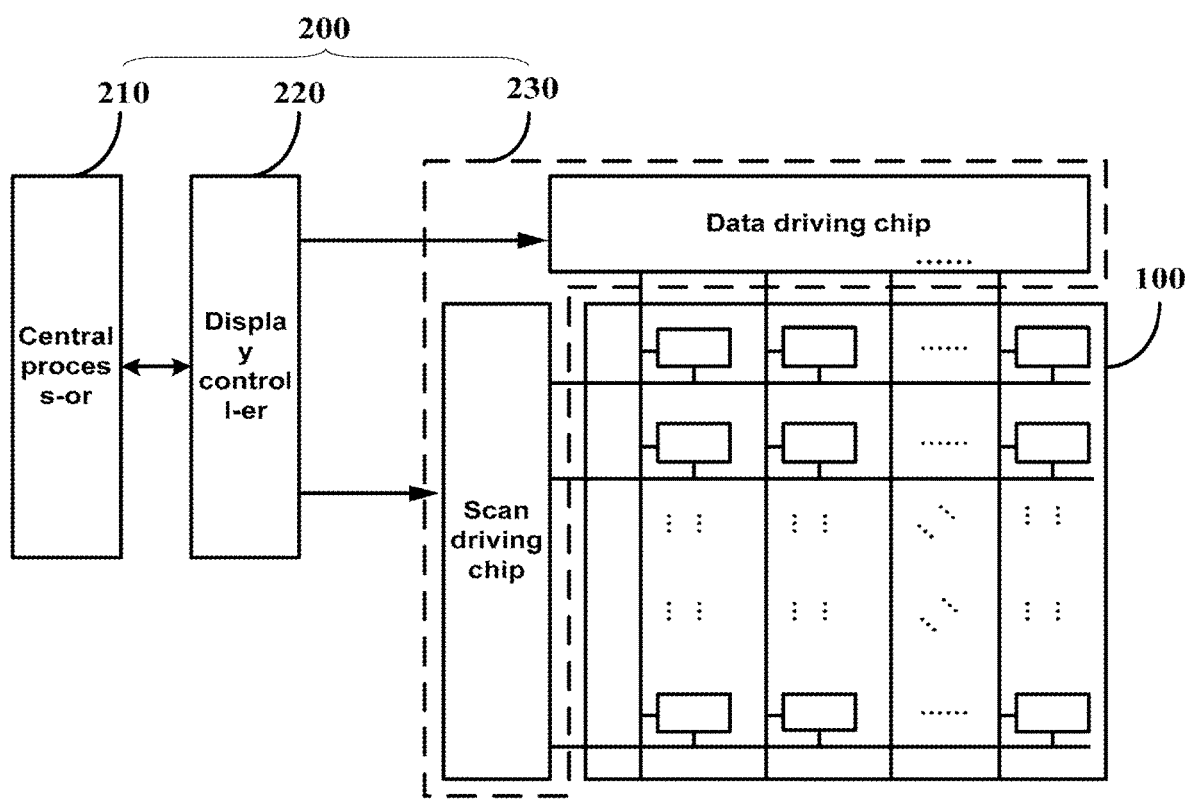
FIG. 2 is a block diagram of another display device, in accordance with some embodiments.

For example, as shown in FIG. 2, the display control apparatus 200 includes a central processor 210, a display controller 220, at least one driving chip 230, etc. The display controller 220 is connected to the central processor 210, and is configured to output a display signal to the at least one driving chip 230 under control of the central processor 210. The at least one driving chip 230 is connected to the display controller 220, and is configured to drive the display panel 100 to display an image according to the display signal.

The display panel 100 may be an organic light-emitting diode (OLED) display panel, a quantum dot light-emitting diode (QLED) display panel or a micro light-emitting diode (Micro LED) display panel, etc.

Figure 3:
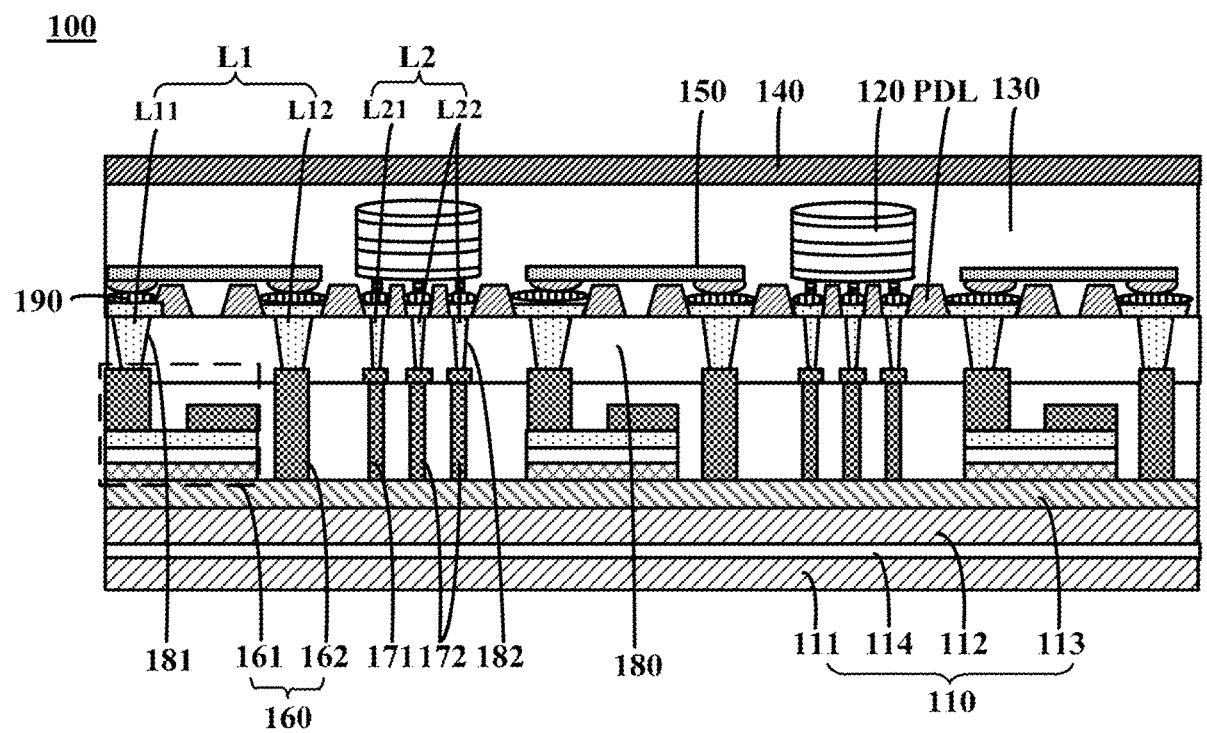
FIG. 3 is a schematic diagram of a display panel, in accordance with some embodiments.

FIG. 3 illustrates a schematic diagram of a display panel 100 according to some embodiments of the present disclosure. As shown in FIG. 3, the display panel 100 includes a base substrate 110, and a plurality of light-emitting devices 150 and a plurality of pressure sensing devices 120 that are disposed on the base substrate 110. Each pressure sensing device 120 is disposed between two adjacent light-emitting devices 150.

In the related art, a pressure sensing apparatus including a plurality of pressure sensing devices is assembled on a frame body of a display device, and a control circuit for controlling the pressure sensing apparatus needs to be provided inside the display device. However, as for this design, not only does the frame body of the display device need to be improved, but also there is a problem of assembly tolerance between the pressure sensing apparatus and the display device, thereby limiting the sensing accuracy of the pressure sensing apparatus.

In the display panel 100 provided by the embodiments of the present disclosure, the plurality of pressure sensing devices 120 are disposed inside the display panel 100. As a result, on the one hand, a display function and a pressure sensing function may be integrated, and the additional value of the product is greatly improved; and on the other hand, the problem of assembly tolerance existing in mounting the pressure sensing apparatus on the frame body of the display device such as a middle frame of a mobile phone may be avoided, thereby improving the pressure sensing accuracy of the pressure sensing device 120.

In some embodiments, as shown in FIG. 3, the base substrate 110 includes a first flexible substrate layer 111, a bonding layer 114, a second flexible substrate layer 112 and a buffer layer 113 that are sequentially stacked. The first flexible substrate layer 111 and the second flexible substrate layer 112 may be bonded together by the bonding layer 114. A plurality of light-emitting devices 150 and a plurality of pressure sensing devices 120 are disposed at a side of the buffer layer 113 away from the first flexible substrate layer 111.

For example, the material of the first flexible substrate layer 111 and second flexible substrate layer 112 includes flexible resin, such as polymethyl methacrylate (PMMA), polyethylene terephthalate (PET), polyethylene (PE), etc. The material of the bonding layer 114 includes adhesive, such as adhesive with epoxy resins, acrylates, polyurethanes, polyvinyl alcohols, polyvinyl chlorides, polyvinyl acetate, urea-formaldehyde resins or phenolic resins. The material of the buffer layer 113 includes at least one of silicon oxide, silicon nitride or silicon oxynitride.

In some embodiments, as shown in FIG. 3, the light-emitting device 150 may be a Micro LED, an OLED, or a QLED, but is not limited thereto.

In some examples, as shown in FIG. 3, the light-emitting device 150 is the Micro LED, which may be transferred to the base substrate 110 by a micro-transfer printing process. Herein, in the micro-transfer printing technology, a transfer device can pick up an array of micro devices (i.e., a plurality of Micro LEDs arranged in an array) from a source substrate and transfer the array of micro devices to a target substrate.

Figure 4:
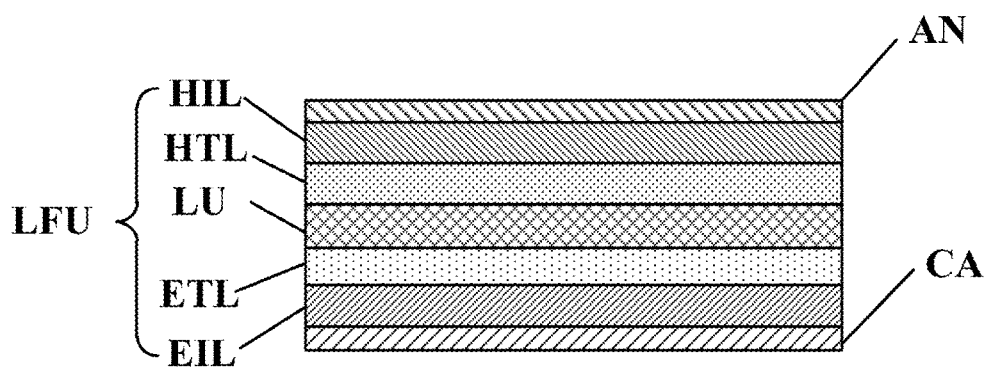
FIG. 4 is a schematic diagram of a light-emitting device, in accordance with some embodiments.

In some other examples, the light-emitting device 150 is the OLED, which may be formed on the base substrate 110 by a plurality of patterning processes. Herein, a patterning process includes steps of exposure, development, etching, etc. For example, as shown in FIG. 4, the light-emitting device 150 includes a cathode CA, an anode AN, and a light-emitting functional layer LFU disposed between the anode AN and the cathode CA. The light-emitting functional layer LFU includes an electron-injecting layer EIL, an electron-transporting layer ETL, a light-emitting layer LU, a hole-transporting layer HTL and a hole-injecting layer HIL that are stacked. In a case where the light-emitting device 150 emits light, the anode AN injects holes into the hole-injecting layer HIL, and the holes are transported to the light-emitting layer LU through the hole-transporting layer HTL; in addition, the cathode CA injects electrons into the electron-injecting layer EIL and the electrons are transported to the light-emitting layer LU through the electron-transporting layer ETL. Eventually, the electrons and the holes are recombined into excitons in the light-emitting layer LU, and energy of the excitons is transferred and released in a form of light, thereby achieving a purpose of light emission of the light-emitting device 150.

In some embodiments, as shown in FIG. 3, a pressure sensing device 120 is provided between any two adjacent light-emitting devices 150, so that the plurality of pressure sensing devices 120 are uniformly distributed in the display panel 100.

Figure 5:
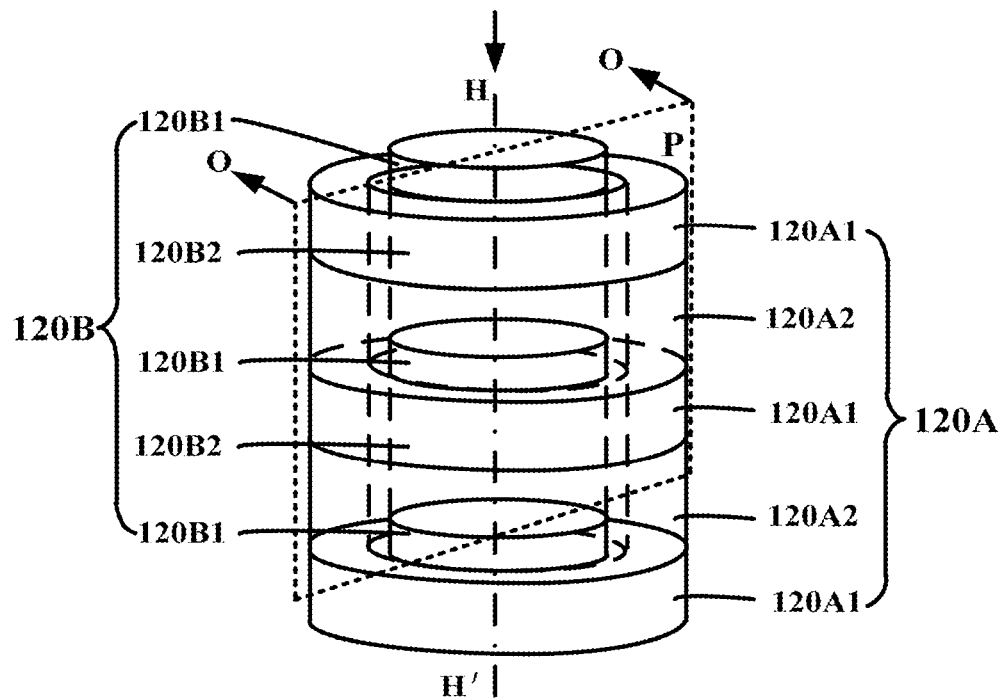
FIG. 5 is a schematic diagram of a pressure sensing device, in accordance with some embodiments.

In some embodiments, as shown in FIG. 5, the pressure sensing device 120 includes a columnar electrode assembly 120B and an annular electrode assembly 120A disposed around the columnar electrode assembly 120B, and the annular electrode assembly 120A and the columnar electrode assembly 120B are insulated from each other.

Figure 6:
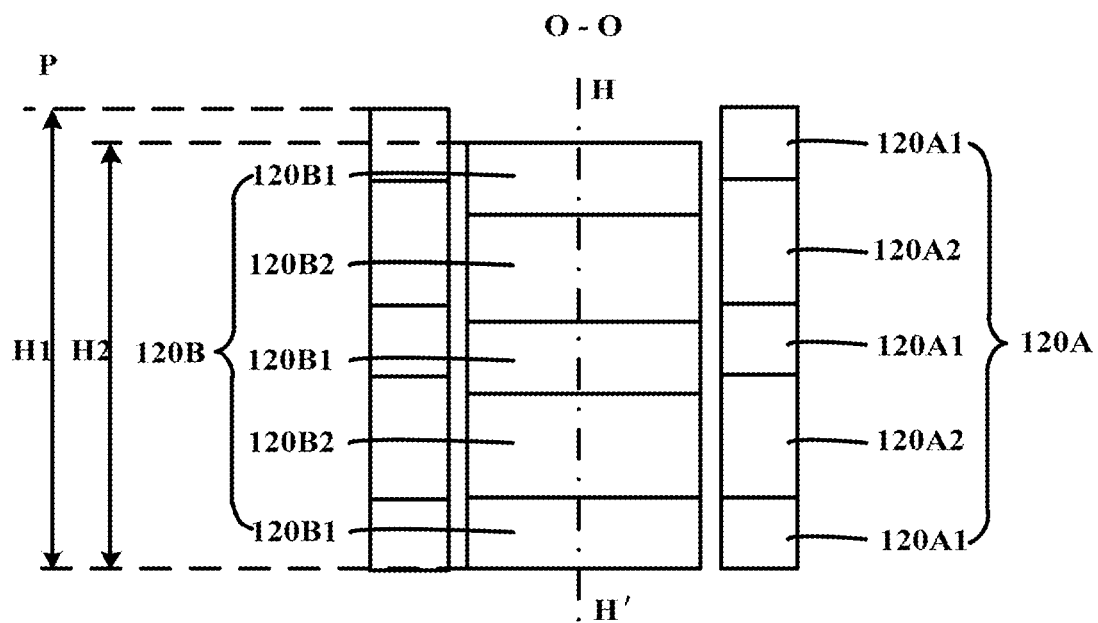
FIG. 6 is a cross-sectional view in a direction O of a pressure sensing device taken along a plane P, in accordance with some embodiments.
Figure 7:
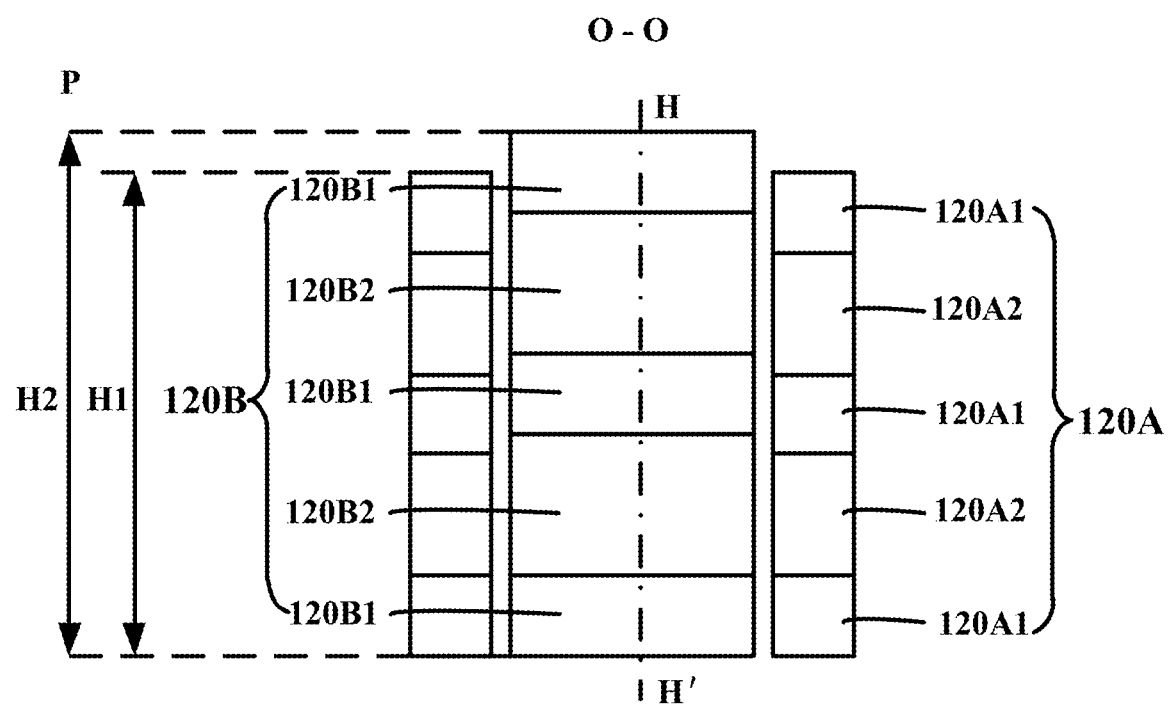
FIG. 7 is another cross-sectional view in the direction O of a pressure sensing device shown FIG. 5 taken along the plane P, in accordance with some embodiments.

As shown in FIGS. 5 to 7, the columnar electrode assembly 120B includes at least one columnar insulating layer 120B2 and at least one columnar electrode 120B1, and the at least one columnar electrode 120B1 and the at least one columnar insulating layer 120B2 are alternately stacked in an axial direction of the columnar electrode 120B1, i.e., the direction of the line HH' in FIGS. 5 to 7. It will be noted that, since the annular electrode assembly 120A is disposed around the columnar electrode assembly 120B, the axial direction of the columnar electrode 120B1 is also the axial direction of the annular electrode assembly 120A.

As shown in FIGS. 5 to 7, the annular electrode assembly 120A includes at least one annular insulating layer 120A2 and at least one annular electrode 120A1, and the at least one annular electrode 120A1 and the at least one annular insulating layer 120A2 are alternately stacked in the axial direction of the columnar electrode 120B1.

It will be noted that, in a case where the pressure sensing device 120 is integrated in the display panel 100, the axial direction of the columnar electrode 120B1 is the same as a thickness direction of the display panel 100.

At least one of the at least one annular insulating layer 120A2 and the at least one columnar insulating layer 120B2 is an elastic insulating layer. That is, at least one annular insulating layer 120A2 is an elastic insulating layer, or at least one columnar insulating layer 120A2 is an elastic insulating layer, or at least one annular insulating layer 120A2 and at least one columnar insulating layer are elastic insulating layers. Herein, the elastic insulating layer refers to an insulating layer that is easily deformed by compression. For example, a material of the elastic insulating layer is an elastic polymer, which includes at least one of polymethacrylate, polycarbonate, polyurethane or rubber.

The materials of the at least one annular electrode 120A1 and the at least one columnar electrode 120B1 include metal materials, such as titanium, aluminium, molybdenum, copper, or a combination thereof.

It will be noted that, the columnar electrode assembly 120B may be an electrode assembly in the form of a circular cylinder, a prism (such as a triangular prism, a square prism, a rectangular prism, etc.), or other pillar, for example, truncated cone. The annular electrode assembly 120A has an annular ring shape or a nearly annular ring shape, which means that the annular electrode assembly 120A is hollow. The radial dimensions of the annular electrode assembly 120A is larger than the radial dimensions of the columnar electrode assembly 120B. If the radial dimensions of the columnar electrode assembly 120B changes along its axial direction, the radial dimensions of the annular electrode assembly 120A changes with it.

The annular electrode assembly 120A and the columnar electrode assembly 120B form a capacitor. In order to ensure that the annular electrode assembly 120A and the columnar electrode assembly 120B form a capacitor, for example, a plane parallel to a thickness direction of the base substrate 110 is set as a projection plane, and an orthographic projection of one columnar electrode 120B1 on the projection plane overlaps with an orthographic projection of a corresponding annular electrode 120A1 on the projection plane. For another example, an orthographic projection of each columnar electrode 120B1 on the projection plane overlaps with an orthographic projection of a corresponding annular electrode 120A1 on the projection plane.

One of the annular electrode 120A1 and the columnar electrode 120B1 serves as a driving electrode, and the other serves as a sensing electrode. A working principle of the pressure sensing device 120 is as follows: the driving electrode receives a driving signal, and the sensing electrode acquires a pressure sensing signal in a capacitive coupling manner and outputs the pressure sensing signal to, for example, a processor; when the capacitance of the capacitor changes due to a relative movement between the annular electrode 120A1 and the columnar electrode 120B1, the pressure sensing signal changes, and thus the processor may determine a corresponding pressure value according to a voltage magnitude of the pressure sensing signal. It will be understood that, in a case where the pressure sensing device 120 is subject to different pressure, the voltage magnitude of the pressure sensing signal will also be different.

In this way, when the pressure sensing device 120 is subject to a force in the axial direction of the columnar electrode 120B1, the relative movement between the annular electrode assembly 120A and the columnar electrode assembly 120B occurs. Since the area of overlap of the annular electrode 120A1 and the columnar electrode 120B1 changes accordingly, the capacitance of the capacitor formed therebetween may change.

In some embodiments, as shown in FIG. 5, the columnar electrode assembly 120B and the annular electrode assembly 120A are coaxially arranged.

In order to ensure that the columnar electrode assembly 120B and the annular electrode assembly 120A are insulated from each other, a radial dimension of the columnar electrode assembly 120B is less than a radial dimension of an inner ring of the annular electrode assembly 120A, so as to ensure that there is a gap between an outer lateral surface of the columnar electrode assembly 120B and an inner lateral surface of the annular electrode assembly 120A, thereby achieving mutual insulation between the two.

The columnar electrode assembly 120B and the annular electrode assembly 120A are arranged coaxially, and that a radial distance between the outer lateral surface of the columnar electrode assembly 120B and the inner lateral surface of the annular electrode assembly 120A is equal everywhere, thereby further ensuring the insulating effect between the columnar electrode assembly 120B and the annular electrode assembly 120A.

In order to ensure that the relative movement between the annular electrode assembly 120A and the columnar electrode assembly 120B may occur, two possible implementations are provided below.

In a first possible implementation, the elastic modulus of the material of the at least one annular insulating layer 120A2 is less than the elastic modulus of the material of the at least one columnar insulating layer 120B2. In this case, when the pressure sensing device 120 is subjected to the force in the axial direction of the columnar electrode 120B1, the annular insulating layer 120A2 is more prone to elastic deformation, so that the relative position of the at least one annular electrode 120A1 and the at least one columnar electrode 120B1 is changed. The elastic modulus here also called modulus of elasticity, and it refers to the ratio of the unit stress to the corresponding unit strain.

On this basis, as shown in FIG. 6, a height H1 of the annular electrode assembly 120A along its axial direction is greater than or equal to a height H2 of the columnar electrode assembly 120B along its axial direction. P in FIG. 5 represents a plane passing through the axis of the columnar electrode 120B1, and FIG. 6 illustrates a cross-sectional view in a direction O of the pressure sensing device 120 taken along the plane P.

In this way, when the pressure sensing device 120 is subject to pressure in the axial direction of the columnar electrode 120B1, the annular electrode assembly 120A is more easily compressed, thereby facilitating the relative movement of the annular electrode assembly 120A and the columnar electrode assembly 120B.

It will be noted that, If the height of the annular electrode assembly 120A is greater than the height of the columnar electrode assembly 120B, it means that, in a case where a plane perpendicular to the thickness direction of the base substrate 110 is taken as a reference plane, and the reference plane passes through the annular electrode assembly 120A and the columnar electrode assembly 120B, a distance from a surface of the annular electrode assembly 120A proximate to the base substrate 110 to the reference plane is equal to a distance from a surface of the columnar electrode assembly 120B proximate to the base substrate 110 to the reference plane, and a distance from a surface of the annular electrode assembly 120A away from the base substrate 110 to the reference plane is greater than a distance from a surface of the columnar electrode assembly 120B away from the base substrate 110 to the reference plane.

In a second possible implementation, the elastic modulus of the material of the at least one columnar insulating layer 120B2 is less than the elastic modulus of the material of the at least one annular insulating layer 120A2. In this case, when the pressure sensing device 120 is subject to the force in the axial direction of the columnar electrode 120B1, the columnar insulating layer 120B2 is more prone to elastic deformation, so that the relative position of the at least one columnar electrode 120B1 and the at least one annular electrode 120A1 is changed.

On this basis, as shown in FIG. 7, the height H1 of the annular electrode assembly 120A along its axial direction is less than or equal to the height H2 of the columnar electrode assembly 120B along its axial direction. In this way, when the pressure sensing device 120 is subject to the pressure in the axial direction of the columnar electrode 120B1, the columnar electrode assembly 120B is more easily compressed, thereby facilitating the relative movement of the annular electrode assembly 120A and the columnar electrode assembly 120B.

It will be noted that, if the height of the annular electrode assembly 120A is less than the height of the columnar electrode assembly 120B, it means that, in the case where a plane perpendicular to the thickness direction of the base substrate 110 is taken as a reference plane, and the reference plane passes through the annular electrode assembly 120A and the columnar electrode assembly 120B, the distance from the surface of the annular electrode assembly 120A proximate to the base substrate 110 to the reference plane is equal to the distance from the surface of the columnar electrode assembly 120B proximate to the base substrate 110 to the reference plane, and the distance from the surface of the annular electrode assembly 120A away from the base substrate 110 to the reference plane is less than the distance from the surface of the columnar electrode assembly 120B away from the base substrate 110 to the reference plane.

In the above two implementations, for example, the material of the at least one annular insulating layer 120A2 may include or may be a first elastic insulating material, the material of the at least one columnar insulating layer 120B2 may include or may be a second elastic insulating material, and an elastic modulus of the first elastic insulating material is different from an elastic modulus of the second elastic insulating material. That is, the annular insulating layer 120A2 and the columnar insulating layer 120B2 are made of respective elastic insulating materials, so that the pressure sensing device 120 is more easily compressed when subject to the pressure in the axial direction of the columnar electrode 120B1, thereby facilitating the relative movement of the annular electrode assembly 120A and the columnar electrode assembly 120B.

In some embodiments, as shown in FIGS. 5 to 7, the number of the at least one annular electrode 120A1 is the same as the number of the at least one columnar electrode 120B1, and the number of the at least one annular insulating layer 120A2 is the same as the number of the at least one columnar insulating layer 120B2. In this case, each annular electrode 120A1 corresponds to a corresponding columnar electrode 120B1, and an orthographic projection of the annular electrode 120A1 on the projection plane overlaps with an orthographic projection of the corresponding columnar electrode 120B1 on the projection plane. In addition, each annular insulating layer 120A2 corresponds to a corresponding columnar insulating layer 120B2, and an orthographic projection of the annular insulating layer 120A2 on the projection plane overlaps with an orthographic projection of the corresponding columnar insulating layer 120B2 on the projection plane.

The number of the at least one annular electrode 120A1 and the number of the at least one columnar electrode 120B1 may be set according to sensitivity of the pressure sensing device 120. The greater the number of the at least one annular electrode 120A1 and the at least one columnar electrode 120B1 is, the higher the sensitivity of the pressure sensing device 120 is. For example, the at least one annular electrode 120A1 includes one annular electrode 120A1, and the at least one columnar electrode 120B1 includes one columnar electrode 120B1. In this case, the pressure sensing device 120 may recognize pressure. For another example, the at least one annular electrode 120A1 includes two annular electrodes 120A1, and the at least one columnar electrode 120B1 includes two columnar electrodes 120B1. In this case, the pressure sensing device 120 may recognize two-level pressure, i.e., a light press and a heavy press. For yet another example, the at least one annular electrode 120A1 includes three annular electrodes 120A1, and the at least one columnar electrode 120B1 includes three columnar electrodes 120B1. In this case, the pressure sensing device 120 may recognize three-level pressure, i.e., a light press, a moderate press, and a heavy press.

In some examples, the at least one annular electrode 120A1 includes a plurality of annular electrodes 120A1, the number of the plurality of annular electrodes 120A1 is one more than the number of the at least one annular insulating layer 120A2, and each annular insulating layer 120A2 is disposed between two adjacent annular electrodes 120A1. The at least one columnar electrode 120B1 includes a plurality of columnar electrodes 120B1, the number of the plurality of columnar electrodes 120B1 is one more than the number of the at least one columnar insulating layer 120B2, and each columnar insulating layer 120B2 is disposed between two adjacent columnar electrodes 120B1. That is, on the base substrate 110, the annular electrode 120A1 and the annular insulating layer 120A2 are alternately stacked, and the columnar electrode 120B1 and the columnar insulating layer 120B2 are alternately stacked.

In some other examples, the at least one annular insulating layer 120A2 includes a plurality of annular insulating layers 120A2, the number of the plurality of annular insulating layers 120A2 is one more than the number of the at least one annular electrode 120A1, and each annular electrode 120A1 is disposed between two adjacent annular insulating layers 120A2. The at least one columnar insulating layer 120B2 includes a plurality of columnar insulating layers 120B2, the number of the plurality of columnar insulating layers 120B2 is one more than the number of the at least one columnar electrode 120B1, and each columnar electrode 120B1 is disposed between two adjacent columnar insulating layers 120B2. That is, on the base substrate 110, the annular insulating layer 120A2 and the annular electrode 120A1 are alternately stacked, and the columnar insulating layer 120B2 and the columnar electrode 120B1 are alternately stacked.

In order to realize a three-level pressure detection of a light press, a moderate press and a heavy press, as shown in FIGS. 5 to 7, the annular electrode assembly 120A includes three annular electrodes 120A1 and two annular insulating layers 120A2, and each annular insulating layer 120A2 is disposed between two adjacent annular electrodes 120A1. The columnar electrode assembly 120B includes three columnar electrodes 120B1 and two columnar insulating layers 120B2, and each columnar insulating layer 120B2 is disposed between two adjacent columnar electrodes 120B1.

Figure 8:
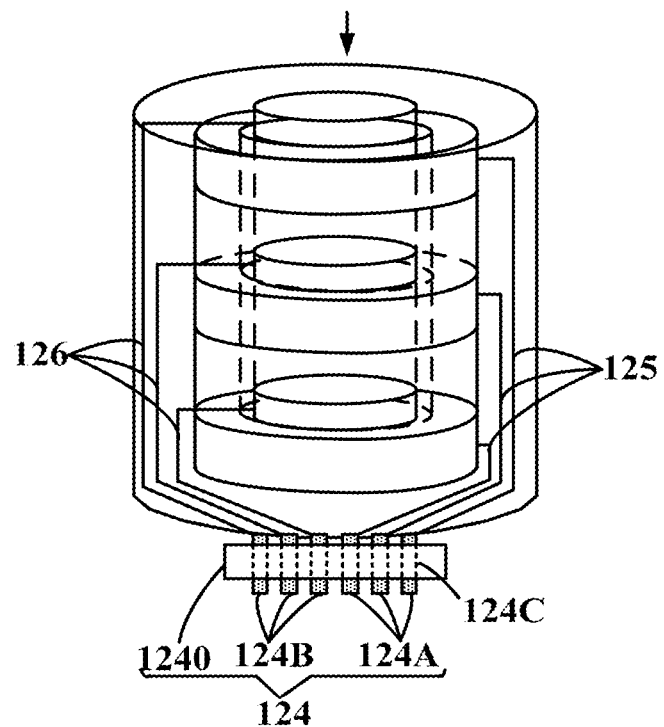
FIG. 8 is a schematic diagram of yet another pressure sensing device, in accordance with some embodiments.

In some embodiments, as shown in FIG. 8, the pressure sensing device 120 further includes a connection portion 124, at least one first connection wire 125 and at least one second connection wire 126. The connection portion 124 includes a base 1240, at least one first connection terminal 124A and at least one second connection terminal 124B. The base 1240 includes a plurality of via holes 124C extending through the base 1240 in a thickness direction of the base 1240. Each first connection terminal 124A and each second connection terminal 124B passes through respective via holes 124C, and protrudes from two surfaces of the base 1240 in the thickness direction thereof. On this basis, portions of the first connection terminal 124A protruding from two surfaces of the base 1240 in the thickness direction thereof serve as first pads, and portions of the second connection terminal 124B protruding from two surfaces of the base 1240 in the thickness direction thereof serve as second pads. Each first connection wire 125 electrically connects a corresponding annular electrode 120A1 to a corresponding first connection terminal 124A, and each second connection wire 126 electrically connects a corresponding columnar electrode 120B1 to a corresponding second connection terminal 124B.

For example, the number of first connection wires 125, the number of first connection terminals 124A and the number of annular electrodes 120A1 are the same, and the number of second connection wires 126, the number of second connection terminals 124B and the number of columnar electrodes 120B1 are the same.

The material of the base 1240 includes fiber cloth made of a resin such as polyethylene terephthalate (PET), polypropylene (PP), polyethylene (PE), polysalfone (PSF), or polyphenylene sulfide (PPS), glass fiber cloth such as glass cloth, metal fiber cloth such as metal mesh screen, or the like. The materials of the at least one first connection terminal 124A and the at least one second connection terminal 124B may include solder, such as tin-based alloy. The materials of at least one first connection wire 125 and at least one second connection wire 126 may include metal materials, such as titanium, aluminium, molybdenum, copper, or a combination thereof.

A structure and a working principle of the pressure sensing device 120 provided by some embodiments of the present disclosure will be described below with reference to the accompanying drawings.

Figure 9:
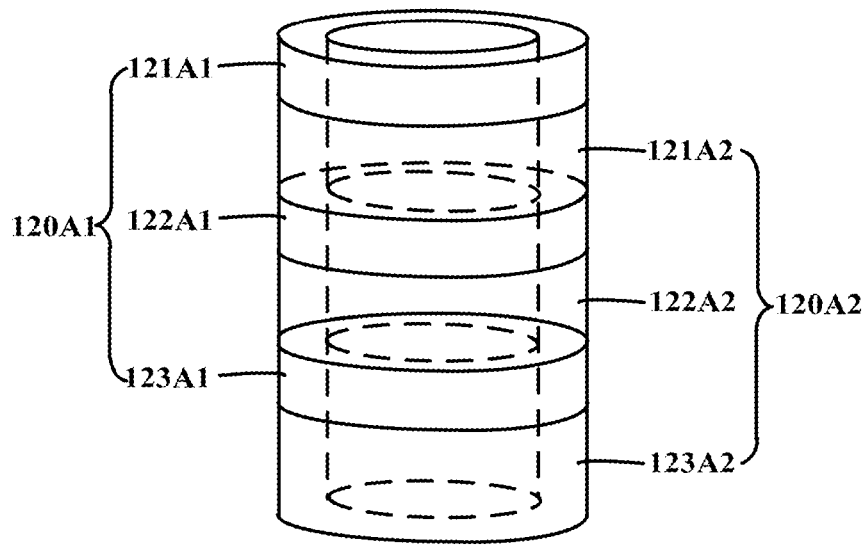
FIG. 9 is a schematic diagram of an annular electrode assembly, in accordance with some embodiments.

As shown in FIG. 9, the at least one annular insulating layer 120A2 includes three annular insulating layers 120A2, i.e., a first annular insulating layer 121A2, a second annular insulating layer 122A2 and a third annular insulating layer 123A2. The at least one annular electrode 120A1 includes three annular electrodes 120A1, i.e., a first annular electrode 121A1, a second annular electrode 122A1 and a third annular electrode 123A1. The first annular insulating layer 121A2 is disposed between the first annular electrode 121A1 and the second annular electrode 122A1, the second annular insulating layer 122A2 is disposed between the second annular electrode 122A1 and the third annular electrode 123A1, and the third annular insulating layer 123A2 is disposed on a surface of the third annular electrode 123A1 facing away from the second annular insulating layer 122A2. As shown in FIG. 8, the first annular electrode 121A1 is electrically connected to one first connection terminal 124A through one first connection wire 125, the second annular electrode 122A1 is electrically connected to another first connection terminal 124A through another first connection wire 125, and the third annular electrode 123A1 is electrically connected to yet another first connection terminal 124A through yet another third connection wire 125.

Figure 10:
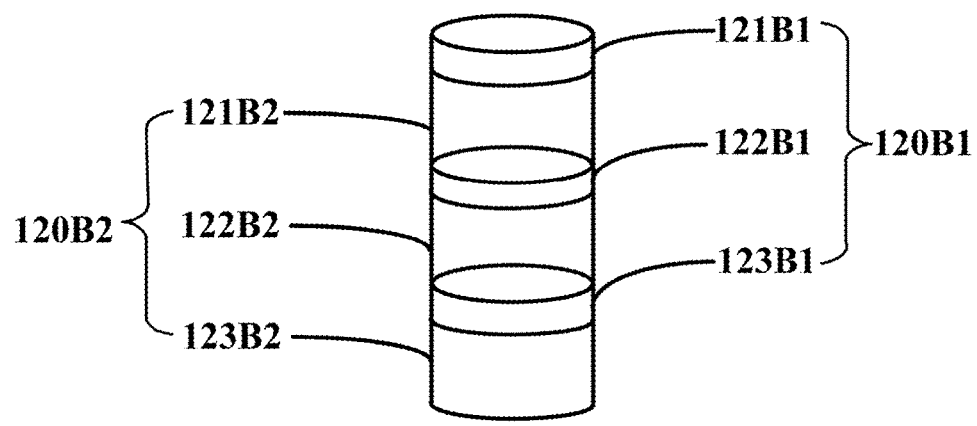
FIG. 10 is a schematic diagram of a columnar electrode assembly, in accordance with some embodiments.

As shown in FIG. 10, the at least one columnar insulating layer 120B2 includes three columnar insulating layers 120B2, i.e., a first columnar insulating layer 121B2, a second columnar insulating layer 122B2 and a third columnar insulating layer 123B2. The at least one columnar electrode 120B1 includes three columnar electrodes 120B1, i.e., a first columnar electrode 121B1, a second columnar electrode 122B1 and a third columnar electrode 123B1. The first columnar insulating layer 12182 is disposed between the first columnar electrode 121B1 and the second columnar electrode 12261, the second columnar insulating layer 12262 is disposed between the second columnar electrode 12281 and the third columnar electrode 123B1, and the third columnar insulating layer 123B2 is disposed on a surface of the third columnar electrode 12361 facing away from the second columnar insulating layer 122B2. As shown in FIG. 8, the first columnar electrode 121B1 is electrically connected to one second connection terminal 1246 through one second connection wire 126, the second columnar electrode 122B1 is electrically connected to another second connection terminal 124B through another second connection wire 126, and the third columnar electrode 123B1 is electrically connected to yet another second connection terminal 124B through yet another second connection wire 126.

The elastic modulus of the material of the annular insulating layer 120A2 is greater than the elastic modulus of the material of the columnar insulating layer 120B2. The annular electrode assembly 120A has a same overall height as the columnar electrode assembly 120B. Moreover, the first columnar electrode 12181 has a same height as the first annular electrode 121A1, the second columnar electrode 12281 has a same height as the second annular electrode 122A1, and the third columnar electrode 123B1 has a same height as the third annular electrode 123A1. The first annular insulating layer 121A2 has a same height as the first columnar insulating layer 12162, the second annular insulating layer 122A2 has a same height as the second columnar insulating layer 12282, and the third annular insulating layer 123A2 has a same height as the third columnar insulating layer 12362.

It will be noted that the height of a certain component here refers to the dimension of the component in its axial direction. For example, the height of the first columnar electrode 121B1 is the dimension of the first columnar electrode 121B1 in its axial direction.

Figure 11A:
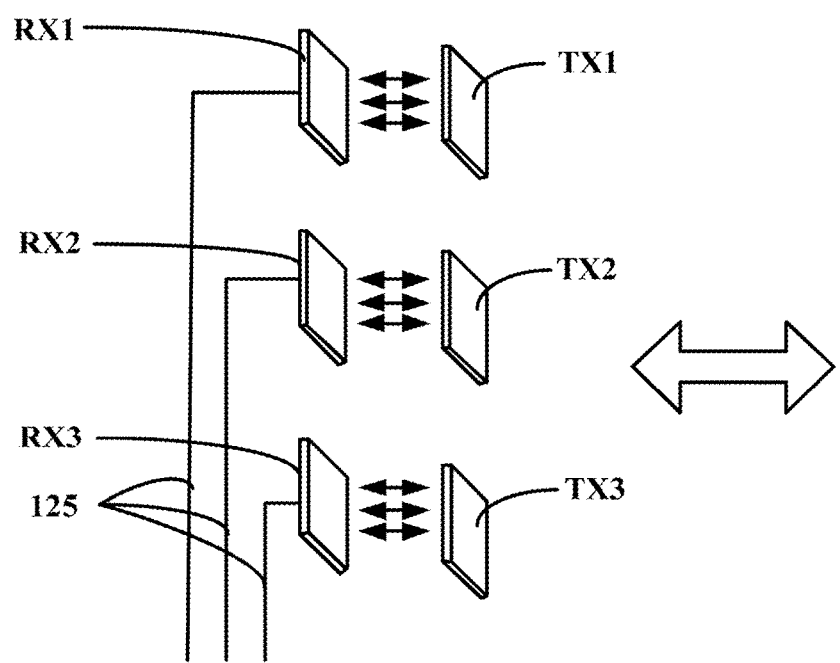
FIGS. 11A to 14 are pressure sensing schematic diagrams of a pressure sensing device, in accordance with some embodiments.

For convenience of description, as shown in FIG. 11A, the first annular electrode 121A1, the second annular electrode 122A1 and the third annular electrode 123A1 are defined as a first sensing electrode RX1, a second sensing electrode RX2 and a third sensing electrode RX3, respectively, and the first columnar electrode 121B1, the second columnar electrode 122B1 and the third columnar electrode 123B1 are defined as a first driving electrode TX1, a second driving electrode TX2 and a third driving electrode TX3, respectively.

Figure 11B:
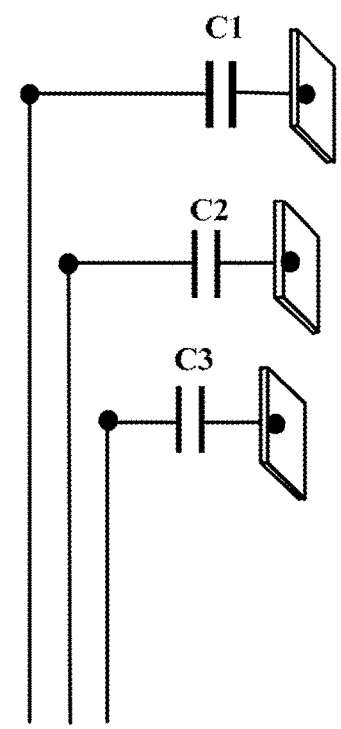

As shown in FIGS. 11A and 11B, when the pressure sensing device 120 is not subject to the pressure in the axial direction of the columnar electrode 120B1, a plane where a bottom surface of the first sensing electrode RX1 is located and a plane where a bottom surface of the first driving electrode TX1 is located have a first preset distance therebetween in the axial direction of the columnar electrode 120B1. In this case, a position where the first driving electrode TX1 is located is defined as a first position. A plane where a bottom surface of the second sensing electrode RX2 is located and a plane where a bottom surface of the second driving electrode TX2 is located also have the first preset distance therebetween in the axial direction of the columnar electrode 120B1. In this case, a position where the second driving electrode TX2 is located is defined as a second position. A plane where a bottom surface of the third sensing electrode RX3 is located and a plane where a bottom surface of the third driving electrode TX3 is located also have the first preset distance therebetween in the axial direction of the columnar electrode 120B1. In this case, a position where the third driving electrode TX3 is located is defined as a third position.

Figure 12:
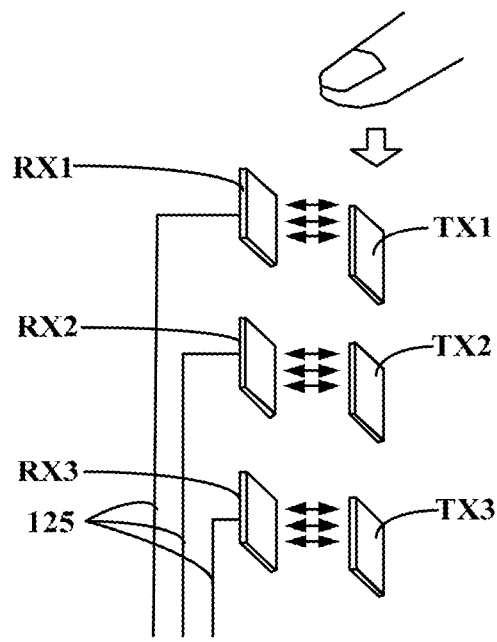
Figure 13:
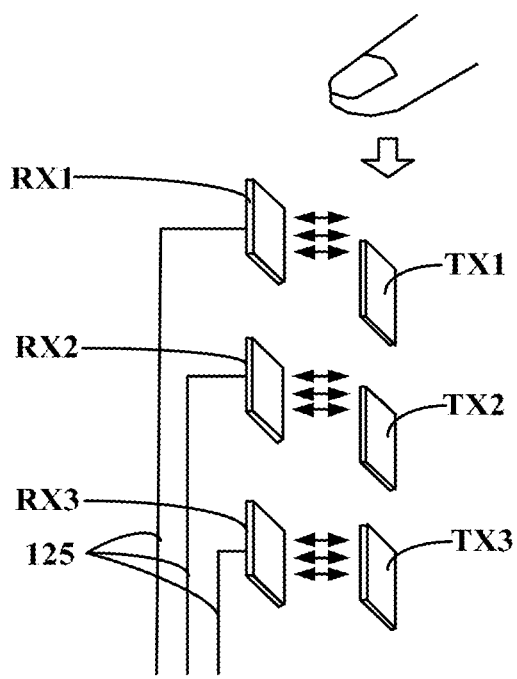
Figure 14:
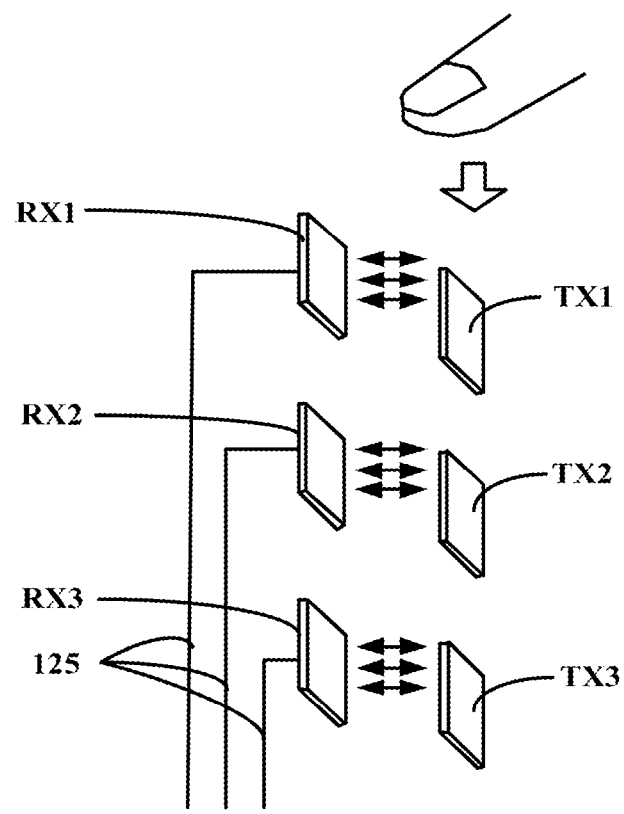

As shown in FIGS. 12 to 14, when the pressure sensing device 120 is subject to the pressure in the axial direction of the columnar electrode 120B1, since the elastic modulus of the material of the annular insulating layer 120A2 is different from the elastic modulus of the material of the columnar insulating layer 120B2, relative positions of the three sensing electrodes included in the annular electrode assembly 120A and the three driving electrodes included in the columnar electrode assembly 120B are changed.

For example, as shown in FIG. 12, the first driving electrode TX1 at the first position moves downward in the axial direction of the columnar electrode 120B1, so that a capacitance of a first sub-capacitor C1 formed by the first driving electrode TX1 and the first sensing electrode RX1 is changed, and positions of the other two driving electrodes are not changed. In this case, a capacitance sensed by the first sensing electrode RX1 is changed, and capacitances sensed by the second sensing electrode RX2 and the third sensing electrode RX3 are not changed, and a processor may determine that this state is a light press.

For another example, as shown in FIG. 13, as the pressure increases, the first driving electrode TX1 at the first position moves downward in the axial direction of the columnar electrode 120B1, so that the capacitance of the first sub-capacitor C1 formed by the first driving electrode TX1 and the first sensing electrode RX1 is changed. The second driving electrode TX2 at the second position also moves downward in the axial direction of the columnar electrode 120B1, so that a capacitance of a second sub-capacitor C2 formed by the second driving electrode TX2 and the second sensing electrode RX2 is also changed. A position of the third driving electrode TX3 is not changed. In this case, capacitances sensed by the first sensing electrode RX1 and the second sensing electrode RX2 are changed, and a capacitance sensed by the third sensing electrode RX3 is not changed, and the processor may determine that this state is a moderate press.

For yet another example, as shown in FIG. 14, as the pressure further increases, the first driving electrode TX1 at the first position moves downward in the axial direction of the columnar electrode 120B1, so that the capacitance of the first sub-capacitor C1 formed by the first driving electrode TX1 and the first sensing electrode RX1 is changed. The second driving electrode TX2 at the second position also moves downward in the axial direction of the columnar electrode 120B1, so that the capacitance of the second sub-capacitor C2 formed by the second driving electrode TX2 and the second sensing electrode RX2 is also changed. The third driving electrode TX3 at the third position also moves downward in the axial direction of the columnar electrode 120B1, so that a capacitance of a third sub-capacitor C3 formed by the third driving electrode TX3 and the third sensing electrode RX3 is also changed. In this case, capacitances sensed by the first sensing electrode RX1, the second sensing electrode RX2 and the third sensing electrode RX3 are all changed, and the processor may determine that this state is a heavy press.

Figure 15:
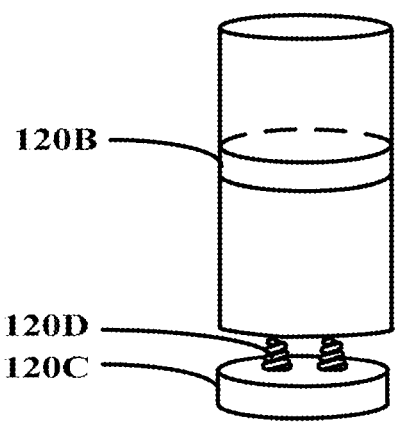
FIG. 15 is a schematic diagram of yet another pressure sensing device, in accordance with some embodiments.

In some embodiments, as shown in FIG. 15, the pressure sensing device 120 further includes an insulating plate 120C and at least one spring member 120D. The at least one spring member 120D is disposed between the insulating plate 120C and the columnar electrode assembly 120B. An end of each spring member 120O is fixed on the insulating plate 120C, and an opposite end of the spring member 120D is fixed on an end face of the columnar electrode assembly 120B. In this way, when the pressure sensing device 120 is subject to the pressure in the axial direction of the columnar electrode 120B1, the spring member 120D may cause the columnar electrode assembly 120B to move relative to the annular electrode assembly 120A in the axial direction of the columnar electrode 120B1.

The material of the insulating plate 120C may include resin, such as epoxy resin, phenol-formaldehyde resin, or melamine-formaldehyde resin, etc. The material of the at least one spring member 120D may include alloy spring steel, such as 60Si2Mn, 50CrVA, etc.

Since the spring member 120D has a larger stretchable space than an elastic material, the spring member 120D may be utilized to realize a relative movement of the columnar electrode assembly 120B and the annular electrode assembly 120A. For example, the columnar electrode assembly 120B includes only one columnar electrode 120B1. As shown in FIG. 9, when the pressure sensing device 120 is not subject to the pressure in the axial direction of the columnar electrode 120B1, the columnar electrode 120B1 is at a first position corresponding to the first annular electrode 121A; when the pressure sensing device 120 is subject to the pressure in the axial direction of the columnar electrode 120B1, the columnar electrode 120B1 moves to a second position corresponding to the second annular electrode 122A; when the pressure sensing device 120 is subject to greater pressure in the axial direction of the columnar electrode 120B1, the columnar electrode 120B1 moves to a third position corresponding to the third annular electrode 123A. That is, a relative movement occurs between the columnar electrode 120B1 and the annular electrodes 120A1 in the annular electrode assembly 120A, and according to a magnitude of pressure, the columnar electrode 120B1 may form a sub-capacitor with a different annular electrode 120A1, thereby providing voltage data for determining a pressing force. The number of spring members 120D is determined according to actual needs.

In some examples, the insulating plate 120C is disposed at a side of the base 1240 of the connection portion 124 proximate to the columnar electrode assembly 120B, and is offset from positions of the first connection terminal 124A and the second connection terminal 124B.

In some other examples, the insulating plate 120C is a portion of the base 1240 facing the columnar electrode assembly 120B, and the first connection terminal 124A and the second connection terminal 124B are not provided in the portion.

In some embodiments, as shown in FIG. 3, the display panel 100 further includes a plurality of pixel driving circuits 160 disposed on the base substrate 110. Each pixel driving circuit 160 is disposed between the base substrate 110 and a corresponding light-emitting device 150, and is electrically connected to the light-emitting device 150. The pixel driving circuit 160 is configured to drive the corresponding light-emitting device 150 to emit light.

In some embodiments, as shown in FIG. 3, the display panel 100 further includes a plurality of driving signal lines 171 and a plurality of sensing signal lines 172 that are disposed on the base substrate 110. The plurality of driving signal lines 171 are divided into a plurality of driving signal line groups, and each driving signal line group includes at least one driving signal line. The plurality of sensing signal lines 172 are divided into a plurality of sensing signal line groups, and each sensing signal line group includes at least one sensing signal line. Each driving signal line group and a corresponding sensing signal line group are disposed between the base substrate 110 and a corresponding pressure sensing device 120, the driving signal line group is configured to supply a driving signal to the pressure sensing device 120, and the sensing signal line group is configured to receive a pressure sensing signal from the pressure sensing device 120. Herein, the driving signal line 171 and the sensing signal line 172 are signal lines electrically connected to the pressure sensing device 120. For example, as shown in FIGS. 3 and 8, driving signal lines 171 in the driving signal line group may be electrically connected to the first connection terminals 124A in a one-to-one correspondence manner, and sensing signal lines 172 in the sensing signal line group may be electrically connected to the second connection terminals 124B in a one-to-one correspondence manner.

In some embodiments, the plurality of light-emitting devices 150 includes micro light-emitting diodes (Micro LEDs), and both the Micro LEDs and the plurality of pressure sensing devices 120 are pre-fabricated micro devices, which may be directly transferred to the base substrate 110 by a micro-transfer printing process.

As shown in FIG. 3, the display panel 100 further includes a planarization layer 180, a plurality of first lead-out structures L1 and a plurality of second lead-out structures L2. The planarization layer 180 is disposed between layers where the plurality of pixel driving circuits 160, the plurality of driving signal lines 171 and the plurality of sensing signal lines 172 are located and layers where the plurality of light-emitting devices 150 and the plurality of pressure sensing devices 120 are located. The planarization layer 180 has a plurality of first via holes 181 and a plurality of second via holes 182. Each light-emitting device 150 corresponds to two first via holes 181, and each pressure sensing device 120 corresponds to at least two second via holes 182.

The pixel driving circuit 160 includes a plurality of thin film transistors 161 and a supply electrode 162. Each first lead-out structure L1 includes a first conductive pillar L11 and a second conductive pillar L12. One end of the first conductive pillar L11 is electrically connected to one of the plurality of thin film transistor 161 through a corresponding first via hole 181, an opposite end of the first conductive pillar L11 protrudes from a surface of the planarization layer 180 facing away from the plurality of thin film transistors 161 to form a first contact. One end of the second conductive pillar L12 is electrically connected to the supply electrode 162 through another first via hole 181, and an opposite end of the second conductive pillar L12 protrudes from the surface of the planarization layer 180 facing away from the plurality of thin film transistors 161 to form another first contacts. The display panel 100 may further include solder portions 190 disposed at positions of the two first contacts respectively, and in this case, a cathode and an anode of the light-emitting device 150 may be electrically connected to the solder portions 190 at the positions of the two first contacts, respectively.

Each second lead-out structure L2 includes at least one third conductive pillar L21 and at least one fourth conductive pillar L22, one end of each third conductive pillar L21 is electrically connected to a corresponding driving signal line 171 through one second via hole 182, and an opposite end of the third conductive pillar L21 protrudes from the surface of the planarization layer 180 facing away from the plurality of thin film transistors 161 to form a second contact. One end of each fourth conductive pillar L22 is electrically connected to a corresponding sensing signal line 172 through another second via hole 182, and an opposite end of the at least one fourth conductive pillar L22 protrudes from the surface of the planarization layer 180 facing away from the plurality of thin film transistors 161 to form another second contact. The solder portions 190 disposed at positions of the at least two second contacts respectively, and in this case, the first connection terminal 124A and the second connection terminal 124B of the pressure sensing device 120 may be electrically connected to the solder portions 190 at the positions of the two second contacts, respectively.

In this way, the first lead-out structure L1 and the second lead-out structure L2 may lead out the signals of the pixel driving circuit 160, the driving signal line 171 and the sensing signal line 172 to a top of the planarization layer 180. In a case where the Micro LED 150 and the pressure sensing device 120 are transferred to the display panel 100 by using a micro-transfer printing process, the Micro LED 150 and the pressure sensing device 120 may be electrically connected to the first lead-out structure L1 and the second lead-out structure L2, respectively.

Figure 16:
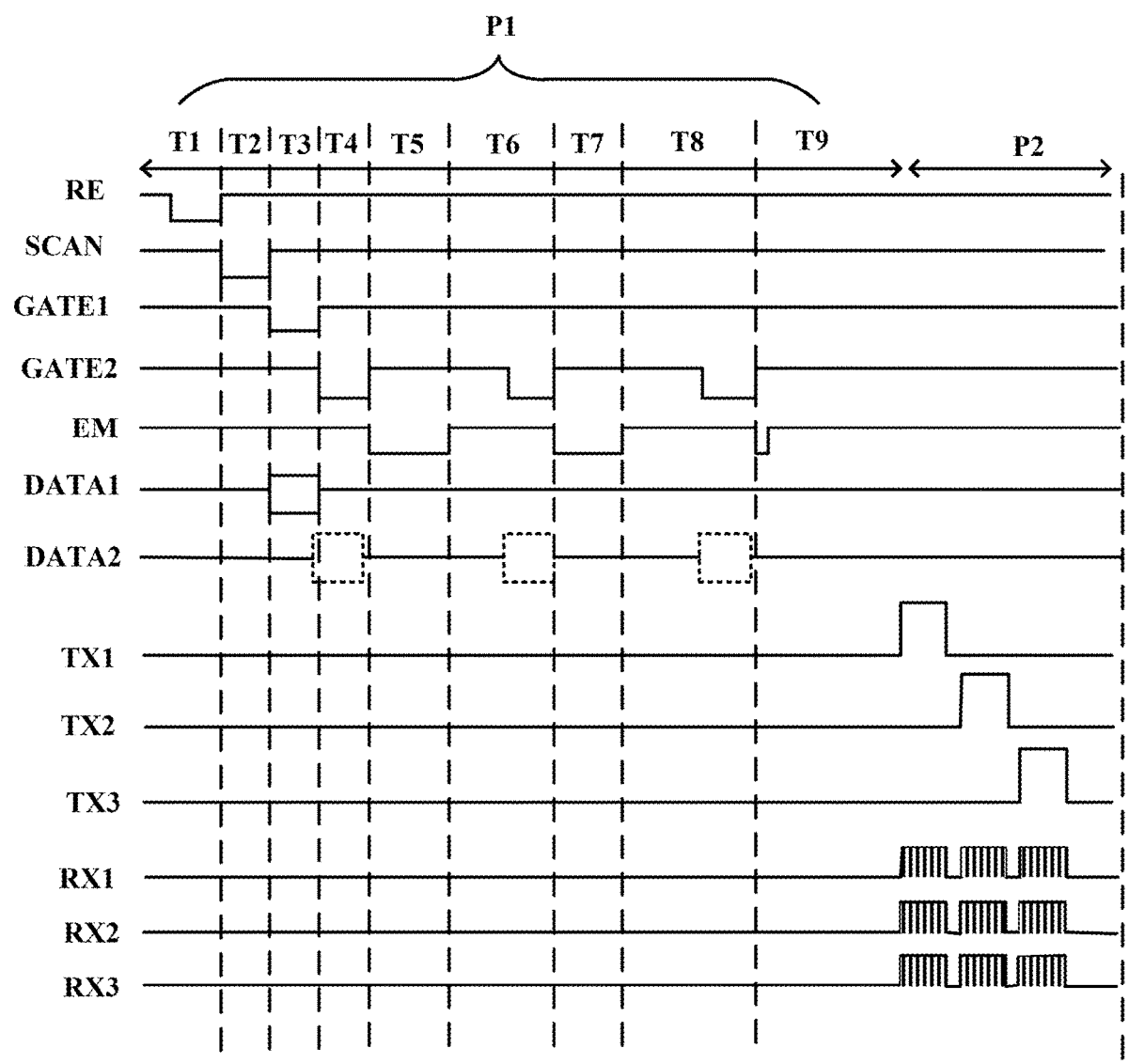
FIG. 16 is a timing diagram of a pixel driving circuit, in accordance with some embodiments.

As shown in FIG. 16, a frame period of the display panel is divided into a display period P1 and a pressure sensing period P2. In the display period P1, the pixel driving circuit 160 drives the corresponding light-emitting device 150 to emit light. In the pressure sensing period P2, for example, the first driving electrode TX1, the second driving electrode TX2 and the third driving electrode TX3 included in the columnar electrode assembly 120B that serve as driving electrodes sequentially move downward under action of pressure, and the first sensing electrode RX1, the second sensing electrode RX2 and the third sensing electrode RX3 included in the annular electrode assembly 120A that serve as sensing electrodes may output a corresponding voltage signal according to sensed capacitance changes of the first sub-capacitor C1, the second sub-capacitor C2 and the third sub-capacitor C3. Therefore, the magnitude of pressure sensed by the pressure sensing device 120 may be determined by detecting changes in the pressure sensing signal in dimensions of time, voltage, etc.

Figure 17:
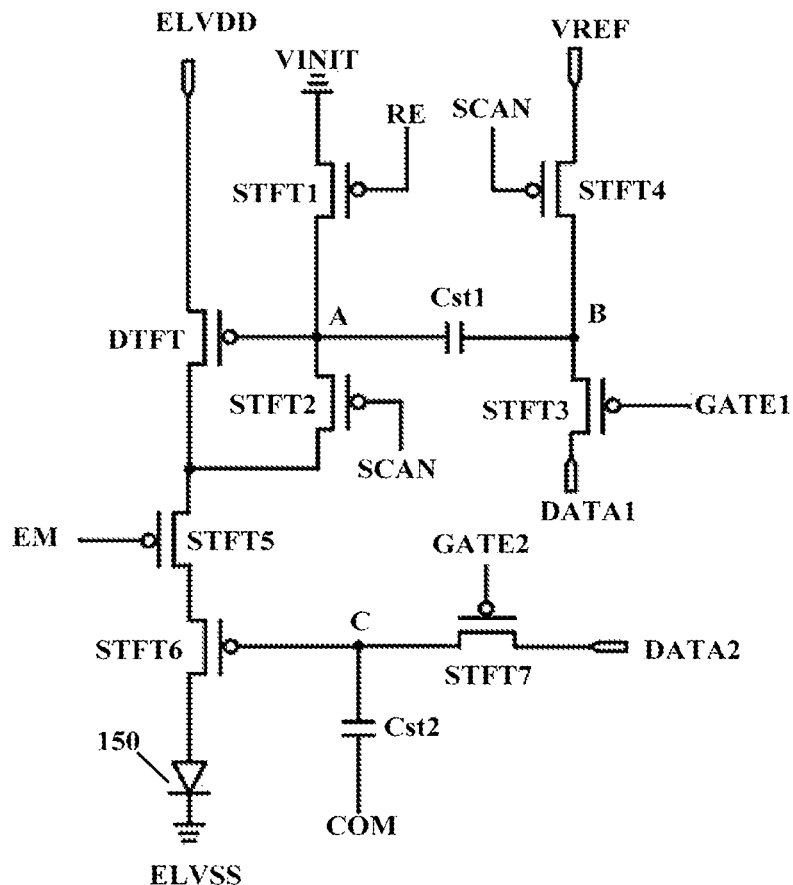
FIG. 17 is an equivalent circuit diagram of a pixel driving circuit, in accordance with some embodiments.

For example, FIG. 17 shows an equivalent circuit diagram of a pixel driving circuit 160. The pixel driving circuit 160 includes a first storage capacitor Cst1, a second storage capacitor Cst2, a driving transistor DTFT, a first switching transistor STFT1, a second switching transistor STFT2, a third switching transistor STFT3, a fourth switching transistor STFT4, a fifth switching transistor STFT5, a sixth switching transistor STFT6 and a seventh switching transistor STFT7. That is, the pixel driving circuit 160 has an 8T2C structure. As shown in FIG. 17, a control terminal of the first switching transistor STFT1 is coupled to a reset signal terminal RE, a signal input terminal of the first switching transistor STFT1 is coupled to an initial signal terminal VINIT, and a signal output terminal of the first switching transistor STFT1 is coupled to a first node A. A control terminal of the second switching transistor STFT2 is coupled to a scanning signal terminal SCAN, a signal input terminal of the second switching transistor STFT2 is coupled to the first node A, and a signal output terminal of the second switching transistor STFT2 is coupled to a signal output terminal of the driving transistor DTFT. A control terminal of the driving transistor DTFT is coupled to the first node A, and the signal input terminal of the driving transistor DTFT is coupled to a power supply signal terminal ELVDD. A control terminal of the third switching transistor STFT3 is coupled to a first gate signal terminal GATE1, a signal input terminal of the third switching transistor STFT3 is coupled to a first data signal terminal DATA1, and a signal output terminal of the third switching transistor STFT3 is coupled to a second node B. A control terminal of the fourth switching transistor STFT4 is coupled to the scanning signal terminal SCAN, a signal input terminal of the fourth switching transistor STFT4 is coupled to a reference signal terminal VREF, and a signal output terminal of the fourth switching transistor STFT4 is coupled to the second node B. A first electrode of the first storage capacitor Cst1 is coupled to the first node A, and a second electrode of the first storage capacitor Cst1 is coupled to the second node B.

As shown in FIG. 17, a control terminal of the fifth switching transistor STFT5 is coupled to a light-emitting signal terminal EM, a signal input terminal of the fifth switching transistor STFT5 is coupled to the signal output terminal of the driving transistor DTFT, and a signal output terminal of the fifth switching transistor STFT5 is coupled to a signal input terminal of the sixth switching transistor STFT6. A signal output terminal of the sixth switching transistor STFT6 is coupled to the light-emitting device 150, and a control terminal of the sixth switching transistor STFT6 is coupled to a third node C. A signal input terminal of the seventh switching transistor STFT7 is coupled to a second data signal terminal DATA2, a signal output terminal of the seventh switching transistor STFT7 is coupled to the third node C, and a control terminal of the seventh switching transistor STFT7 is coupled to a second gate signal terminal GATE2. A first electrode of the second storage capacitor Cst2 is coupled to a common signal terminal COM, and a second electrode of the second storage capacitor Cst2 is coupled to the third node C. It will be understood that the signal output terminal of the sixth switching transistor STFT6 is coupled to an anode of the light-emitting device 150, and a cathode of the light-emitting device 150 is coupled to a power supply common terminal ELVSS (the supply electrode 162).

In order to facilitate explanation of the working principle of the pixel driving circuit 160, the following description will be made with reference to FIGS. 16 and 17. Herein, the description will be made by taking an example in which the first switching transistor STFT1, the second switching transistor STFT2, the third switching transistor STFT3, the fourth switching transistor STFT4, the fifth switching transistor STFT5, the sixth switching transistor STFT6, the seventh switching transistor STFT7 and the driving transistor DTFT are all positive channel metal oxide semiconductor (PMOS) transistors.

As shown in FIGS. 16 and 17, the pixel driving circuit 160 may be divided into two units. A first unit is a current control module, which is responsible for outputting compensated saturation current, and mainly includes the first switching transistor STFT1, the second switching transistor STFT2, the third switching transistor STFT3 and the fourth switching transistor STFT4. A second unit is a duration control module, which is used to control brightness of the light-emitting device by means of time integration, and mainly includes the fifth switching transistor STFT5, the sixth switching transistor STFT6 and the seventh switching transistor STFT7.

As shown in FIGS. 16 and 17, in a first period T1, the reset signal terminal RE provides a low level signal to control the first switching transistor STFT1 to be turned on, and an initial signal provided by the initial signal terminal VINIT is transmitted to the first node A through the first switching transistor STFT1, so that a voltage at the first node A is set as an initial signal voltage Vinit.

As shown in FIGS. 16 and 17, in a second period T2, under control of the initial signal voltage Vinit, a voltage at the signal output terminal of the driving transistor DTFT is gradually changed into Vdd, which is a power supply signal voltage provided by a power supply signal terminal ELVDD. However, since the driving transistor DTFT has a threshold voltage Vth, the voltage at the signal output terminal of the driving transistor DTFT is a sum of Vdd and Vth. In addition, the scanning signal terminal SCAN provides a low level signal to control the second switching transistor STFT2 and the fourth switching transistor STFT4 to be turned on, so that the voltage at the first node A is equal to the voltage at the signal output terminal of the driving transistor DTFT, that is, the voltage at the first node A is a sum of Vdd and Vth (i.e., Vdd+Vth); and a voltage at the second node B is equal to a reference signal voltage Vref provided by the reference signal terminal VREF.

As shown in FIGS. 16 and 17, in a third period T3, the first gate signal terminal GATE1 provides a low level signal to control the third switching transistor STFT3 to be turned on, and the voltage at the second node B is equal to a first data signal voltage Vdata1 provided by the first data signal terminal DATA1. Since the voltage at the second node B is changed from Vref to Vdata1, that is, an amount of voltage change at the second node B is a difference of Vref and Vdata1 (i.e., Vref−Vdata1), the voltage at the first node A becomes (Vdd+Vth+Vref−Vdata1). A fourth period is executed immediately after the third period T3 is completed.

As shown in FIGS. 16 and 17, in the fourth period T4, the second gate signal terminal GATE2 provides a low level signal to control the seventh switching transistor STFT7 to be turned on, and in this case, a voltage at the third node C is a second data signal voltage Vdata2 provided by the second data signal terminal DATA2. Under control of the voltage at the second node B, the driving transistor DTFT is completely turned on, and under control of the voltage at the third node C, the sixth switching transistor STFT6 is turned on.

As shown in FIGS. 16 and 17, in a fifth period T5, the light-emitting signal terminal EM provides a low level signal to control the fifth switching transistor STFT5 to be turned on, and in this case, a driving current output by the driving transistor DTFT may drive the light-emitting device 150 to emit light. A duration of the low level signal provided by the light-emitting signal terminal EM remains t11. An operating current of the light-emitting device 150 is: Ioled=K(Vgs−Vth)$^2$. As for a PMOS driving transistor DTFT, a source thereof is coupled to the power supply signal terminal ELVDD, so that a source voltage of the driving transistor DTFT is Vdd, and thus a gate-source voltage of the driving transistor DTFT is: Vgs=Vdd+Vth+Vref−Vdata1−Vdd=Vref−Vdata1+Vth. Therefore, the operating current of the light-emitting device 150 is: Ioled=K(Vref−Vdata1+Vth−Vth)$^2$=K(Vref−Vdata1)$^2$, where K is a constant, and is a conductivity factor of the driving transistor DTFT.

As shown in FIGS. 16 and 17, in a sixth period T6, the reset signal terminal RE, the scanning signal terminal SCAN, the light-emitting signal terminal EM, the first gate signal terminal GATE1 and the second gate signal terminal GATE2 all provide a high level signal first, and the operation of the fourth period T4 is repeatedly performed for a duration of t21 at a certain time of the sixth period T6, that is, the low level signal provided by the second gate signal terminal GATE2 controls the seventh switching transistor STFT7 to be turned on, and in this case, the voltage at the third node C is the second data signal voltage Vdata2 provided by the second data signal terminal DATA2. Under control of the voltage at the third node C, the sixth switching transistor STFT6 is turned on, and under the control of the voltage at the second node B, the driving transistor DTFT is completely turned on.

As shown in FIGS. 16 and 17, in a seventh period T7, an operation of the fifth period T5 is repeatedly performed, that is, the low level signal provided by the light-emitting signal terminal EM controls the fifth switching transistor STFT5 to be turned on. In this case, the driving current output by the driving transistor DTFT may drive the light-emitting device 150 to emit light, and duration of the low level signal provided by the light-emitting signal terminal EM is ensured to remain t12, and t12 is less than t11.

As shown in FIGS. 16 and 17, in an eighth period T8, the reset signal terminal RE, the scanning signal terminal SCAN, the light-emitting signal terminal EM, the first gate signal terminal GATE1 and the second gate signal terminal GATE2 all provide a high level signal first, and the operation of the fourth period T4 is repeatedly performed for a duration of t22 at a certain time of the eighth period T8, and t22 is less than t21 (t22<t21).

As shown in FIGS. 16 and 17, in a ninth period T9, the operation of the fifth period T5 is repeatedly performed, and a duration of the low level signal provided by the light-emitting signal terminal EM is ensured to remain t13, t13<t12<t11.

It will be seen from the above that, after being reset in the first period T1, the pixel driving circuit 160 shown in FIG. 17 is compensated in the second period T2 and the third period T3, so that the operating current (saturation current) of the light-emitting device 150 provided by the driving transistor DTFT is: Ioled=K(Vref−Vdata1)$^2$, so as to avoid the influence of the driving transistor DTFT on the operating current of the light-emitting device 150. In addition, through an inter-coordination of the fifth switching transistor STFT5, the sixth switching transistor STFT6 and the seventh switching transistor STFT7, a light-emitting duration and brightness of the light-emitting device 150 may be effectively adjusted and controlled.

It will be noted that a structure of the pixel driving circuit 160 in the embodiments of the present disclosure is not limited to the above 8T2C structure, and the pixel driving circuit 160 may also be a 2T1C pixel driving circuit, a 3T1C pixel driving circuit, or the like. However, in any case, the pixel compensation circuit includes a storage capacitor, a switching transistor, and a driving transistor for driving the light-emitting device to emit light. Both the switching transistor and the driving transistor are selected to be thin film transistors. The type of the thin film transistor may be a NMOS thin film transistor or a PMOS thin film transistor, and a difference thereof only lies in a turn-on condition. As for the NMOS thin film transistor, it is turned on under control of a high level signal, and is turned off under control of a low level signal; and as for the PMOS thin film transistor, it is turned on under the control of the low level signal, and is turned off under the control of the high level signal.

As for a thin film transistor, the thin film transistor includes a gate, a source, a drain, an active layer and a gate insulating layer. For example, a material of the gate and a gate line may be molybdenum (Mo), and a thickness of the gate and the gate line is 2400 Å. A material of the gate insulating layer may be silicon oxynitride or silicon oxide, and a thickness of the gate insulating layer is in a range from 400±28 Å to 8000±56 Å. A material of the active layer is p-type Si, and a thickness of the active layer is 500±25 Å. Both the source and the drain have a three-layer structure. For example, the source and the drain each include a first titanium material layer, an intermediate aluminum material layer and a second titanium material layer that are stacked. A thickness of the first titanium material layer is 300 Å, a thickness of the second titanium material layer is 400 Å, and a thickness of the intermediate aluminum material layer is 4000 Å. The anode of the light-emitting device 150 includes at least one of a first indium tin oxide layer, an intermediate silver material layer or a second indium tin oxide layer. In a case where the anode of the light-emitting device 150 includes the first indium tin oxide layer, the intermediate silver material layer and the second indium tin oxide layer, the first indium tin oxide layer, the intermediate silver material layer and the second indium tin oxide layer are stacked, a thickness of the first indium tin oxide layer and a thickness of the second indium tin oxide layer are both 70 Å, and a thickness of the intermediate silver material layer is 1000 Å. In addition, a material of a dielectric layer between two electrodes included in the first storage capacitor Cst1 and the second storage capacitor Cst2 is silicon nitride.

In some embodiments, as shown in FIG. 3, the display panel 100 further includes an elastic filling layer 130 and a flexible cover plate 140. The elastic filling layer 130 is disposed at a side of the plurality of light-emitting devices 150 and the plurality of pressure sensing devices 120 away from the base substrate 110, and the flexible cover plate 140 is disposed on a surface of the elastic filling layer 130 facing away from the base substrate 110. In a case where the display panel 100 is pressed, the elastic filling layer 130 and the flexible cover plate 140 not only may protect the light-emitting devices 150 and the pressure sensing devices 120 inside the display panel 100, but also may transmit pressure to the pressure sensing devices 120, so that the pressure sensing devices 120 sense a pressure signal.

For example, a material of the elastic filling layer 130 includes at least one of polyimide, polymethacrylate, polycarbonate or polyurethane, and a material of the flexible cover plate 140 includes at least one of polyimide, polyethylene terephthalate or polymethacrylate.

Figure 18:
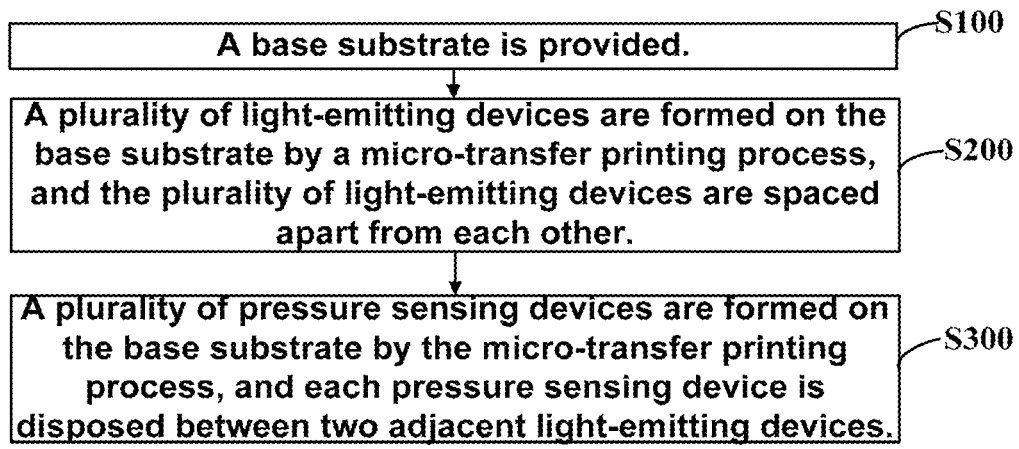
FIG. 18 is a flow chart of a method of manufacturing a display panel, in accordance with some embodiments.

As shown in FIG. 18, some embodiments of the present disclosure provide a method of manufacturing a display panel 100. The method includes step 100 (S100) to step 300 (S300).

In S100, a base substrate 110 is provided.

For example, as shown in FIG. 3, the base substrate 110 includes a first flexible substrate layer 111, a bonding layer 114, a second flexible substrate layer 112 and a buffer layer 113 that are sequentially stacked. A material of the buffer layer 113 is silicon nitride or silicon oxide, and a thickness of the buffer layer 113 is in a range from 1000±70 Å to 3000±210 Å.

In S200, a plurality of light-emitting devices 150 are formed on the base substrate 110 by a micro-transfer printing process, and the plurality of light-emitting devices 150 are spaced apart from each other.

For example, the plurality of light-emitting devices 150 are a plurality of micro light-emitting diodes (Micro LEDs).

It will be noted that, micro-transfer printing process is the use of elastic stamps combined with high-precision motion control of the print head to selectively pick up a large array of micro devices and print (place) it on the target substrate. First, a micro device is fabricated on the source wafer, and then "released" by removing the photoresist layer under the semiconductor circuit. Subsequently, a micro structured elastic stamp is used to pick up the micro devices and print (place) these micro devices on the target substrate.

In S300, a plurality of pressure sensing devices 120 are formed on the base substrate 110 by the micro-transfer printing process, and each pressure sensing device 120 is disposed between two adjacent light-emitting devices 150.

The pressure sensing device 120 is the pressure sensing device 120 in the above embodiments.

It will be noted that an order of S200 and S300 is not limited, and S200 may precede S300 or S300 may precede S200.

Beneficial effects of the method of manufacturing the display panel 100 provided by some embodiments of the present disclosure are the same as the beneficial effects of the above display panel 100, and are not described herein again.

Figure 19:
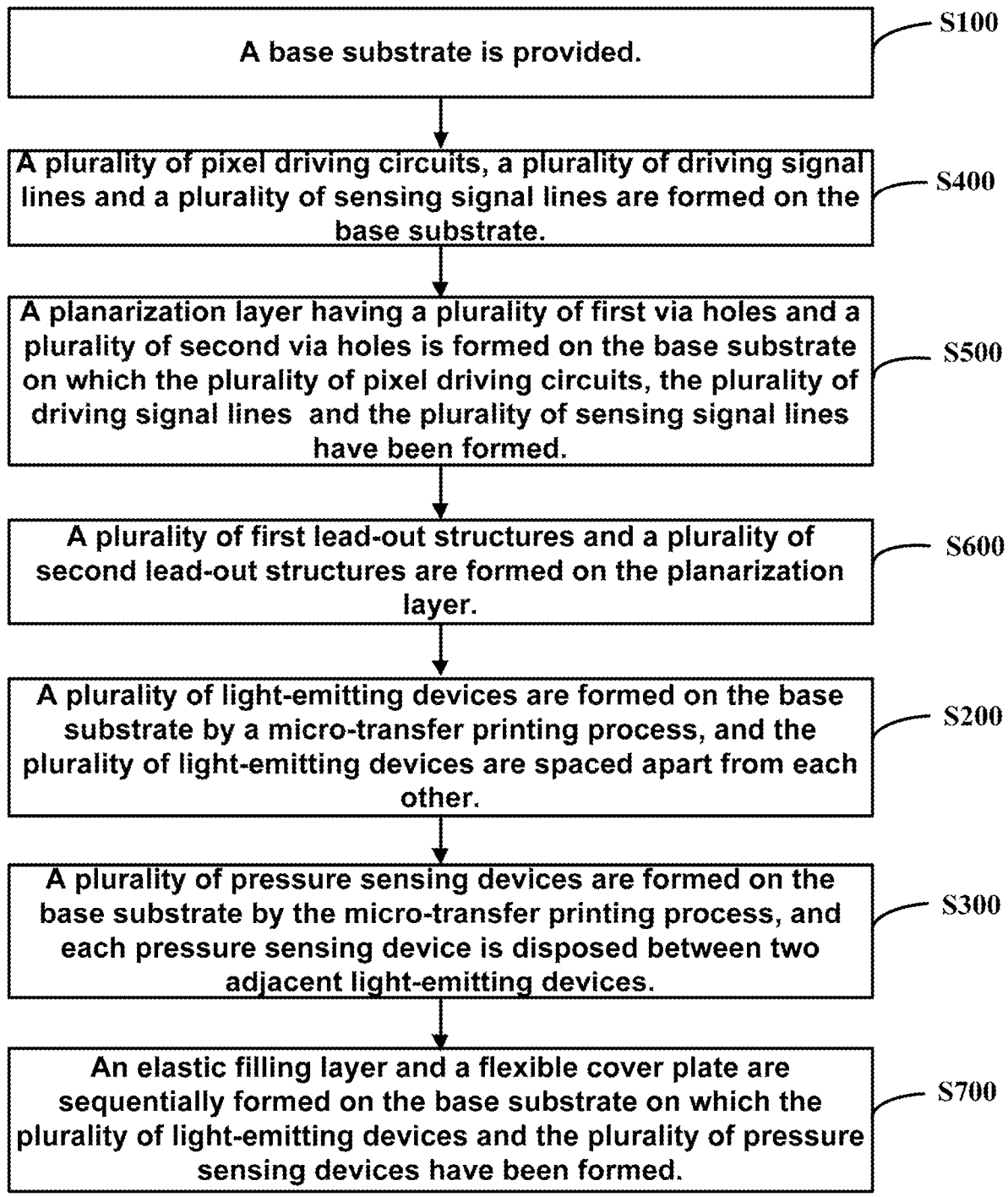
FIG. 19 is a flow chart of another method of manufacturing a display panel, in accordance with some embodiments.

In some embodiments, as shown in FIG. 19, before the plurality of light-emitting devices 150 and the plurality of pressure sensing devices 120 are formed on the base substrate 110, the method of manufacturing the display panel 100 further includes step 400 (S400).

In S400, a plurality of pixel driving circuits 160, a plurality of driving signal lines 171 and a plurality of sensing signal lines 172 are formed on the base substrate 110.

Each pixel driving circuit 160 is formed at a position on the base substrate 110 corresponding to a light emitting device 150 that will be formed, that is, the pixel driving circuit 160 is disposed between the base substrate 110 and the corresponding light-emitting device 150. The plurality of driving signal lines 171 are divided into a plurality of driving signal line groups, and each driving signal line group includes at least one driving signal line. The plurality of sensing signal lines 172 are divided into a plurality of sensing signal line groups, and each sensing signal line group includes at least one sensing signal line. Each driving signal line group and a corresponding sensing signal line group are formed at positions on the base substrate 110 corresponding to a pressure sensing device 120 that will be formed, that is, each driving signal line group and a corresponding sensing signal line group are disposed between the base substrate 110 and the corresponding pressure sensing device 120.

As for details of the pixel driving circuits 160, the driving signal lines 171 and the sensing signal lines 172, reference may be made to the above structural embodiments, which will not be described herein again.

In order to ensure that the light-emitting device 150 may be formed on a relatively flat surface, after the plurality of pixel driving circuits 160, the plurality of driving signal lines 171 and the plurality of sensing signal lines 172 are formed on the base substrate 110, as shown in FIGS. 3 and 19, the method of manufacturing the display panel 100 further includes step 500 (S500) to step 600 (S600).

In S500, a planarization layer 180 having a plurality of first via holes 181 and a plurality of second via holes 182 is formed on the base substrate 110 on which the plurality of pixel driving circuits 160, the plurality of driving signal lines 171 and the plurality of sensing signal lines 172 have been formed.

For example, a material of the planarization layer 180 may be selected from photoresist, polyimide or the like, but is not limited thereto. A thickness of the planarization layer 180 is 20,000 Å, and of course, it may also be set according to actual conditions.

In S600, a plurality of first lead-out structures L1 and a plurality of second lead-out structures L2 are formed on the planarization layer 180.

The pixel driving circuit 160 includes a plurality of thin film transistors 161 and a supply electrode 162. Each first lead-out structure L1 includes a first conductive pillar L11 and a second conductive pillar L12, one end of the first conductive pillar L11 is electrically connected to one of the plurality of thin film transistors 161 through a corresponding first via hole 181, and an opposite end of the first conductive pillar L11 protrudes from a surface of the planarization layer 180 facing away from the plurality of thin film transistors 161 to form a first contact. One end of the second conductive pillar L12 is electrically connected to the supply electrode 162 through another first via hole 181, and an opposite end of the second conductive pillar L12 protrudes from the surface of the planarization layer 180 facing away from the plurality of thin film transistors 161 to form another first contact. Solder portions 190 disposed at positions of the two first contacts respectively, and in this case, a cathode and an anode of the light-emitting device 150 may be electrically connected to the solder portions 190 at the positions of the two first contacts, respectively.

Each second lead-out structure L2 includes at least one third conductive pillar L21 and at least one fourth conductive pillar L22, one end of each third conductive pillar L21 is electrically connected to a corresponding driving signal line 171 through one second via hole 182, and an opposite end of the third conductive pillar L21 protrudes from the surface of the planarization layer 180 facing away from the plurality of thin film transistors 161 to form a second contact. One end of each fourth conductive pillar L22 is electrically connected to a corresponding sensing signal line 172 through another second via hole 182, and an opposite end of the at least one fourth conductive pillar L22 protrudes from the surface of the planarization layer 180 facing away from the plurality of thin film transistors 161 to form another second contact. The solder portions 190 disposed at positions of the at least two second contacts respectively, and in this case, the first connection terminal 124A and the second connection terminal 124B of the pressure sensing device 120 may be electrically connected to the solder portions 190 at the positions of the two second contacts, respectively.

A number of the first via holes 181 may be determined according to a number of the light-emitting devices 150. For example, each light-emitting device 150 corresponds to two first via holes 181.

The number of the second via holes 182 may be determined according to a number of the pressure sensing devices 120 and a number of the wires led out from the pressure sensing devices 120. For example, a number of pressure sensing devices 120 is one, and wires led out from the pressure sensing device 120 include three first connecting wires 125 and three second connecting wires 126, and thus the pressure sensing device 120 corresponds to six second via holes 182.

In an actual display panel 100, the light-emitting devices 150 may be arranged in an array. Therefore, as shown in FIG. 3, before forming the plurality of light-emitting devices 150 and the plurality of pressure sensing devices 120 on the base substrate 110, the method of manufacturing the display panel 100 further includes: forming a pixel defining layer PDL on the planarization layer 180.

It will be understood that openings that the pixel defining layer PDL has are divided into two types. Openings of a first type are used for providing the light-emitting device 150, and openings of a second type are used for providing the pressure sensing device 120. Therefore, the first lead-out structures L1 are exposed to the openings of the first type in a one-to-one correspondence manner, and the second lead-out structures L2 are exposed to the openings of the second type in a one-to-one correspondence manner. A material of the pixel defining layer PDL may be selected from photoresist, polyimide or the like, but is not limited thereto. A thickness of the pixel defining layer PDL may be 15,000 Å, and of course, it may also be set according to actual conditions.

For example, in a case where the light-emitting device 150 is a Micro LED, the Micro-LED may be transferred to the first type of opening by means of micro-transfer printing. In addition, the pressure sensing device 120 may be transferred to the second type of opening by means of micro-transfer printing.

The light-emitting device 150 and the pressure sensing device 120 are formed on the planarization layer 180 by a micro-transfer printing process. In order to ensure the electrical connection effect after the transfer, a surface of the first lead-out structure L1 and a surface of the second lead-out structure L2 may be coated with solder portions (Sn) 190 before transferring the light-emitting device 150 and the pressure sensing device 120.

In some embodiments, as shown in FIGS. 3 and 19, the method of manufacturing the display panel 100 further includes step 700 (S700).

In S700, an elastic filling layer 130 and a flexible cover plate 140 are sequentially formed on the base substrate 110 on which the plurality of light-emitting devices 150 and the plurality of pressure sensing devices 120 have been formed.

As for materials of the elastic filling layer 130 and the flexible cover plate 140, reference may be made to the above structural embodiments, which will not be described herein again.

In the description of the above embodiments, specific features, structures, materials or characteristics may be combined in any suitable manner in any one or more embodiments or examples.

The forgoing descriptions are merely some implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A pressure sensing device, comprising:
    a columnar electrode assembly including at least one columnar electrode and at least one columnar insulating layer that are alternately stacked in an axial direction of a columnar electrode; and
    an annular electrode assembly disposed around the columnar electrode assembly, the annular electrode assembly including at least one annular electrode and at least one annular insulating layer that are alternately stacked in the axial direction of the columnar electrode, the annular electrode assembly and the columnar electrode assembly being insulated from each other, and being configured to form a capacitor, wherein
    at least one of the at least one annular insulating layer and the at least one columnar insulating layer is an elastic insulating layer.

2. The pressure sensing device according to claim 1, wherein an elastic modulus of a material of the at least one annular insulating layer is less than an elastic modulus of a material of the at least one columnar insulating layer, and in the axial direction of the columnar electrode, a height of the annular electrode assembly is greater than or equal to a height of the columnar electrode assembly; or
    the elastic modulus of the material of the at least one columnar insulating layer is less than the elastic modulus of the material of the at least one annular insulating layer, and in the axial direction of the columnar electrode, the height of the annular electrode assembly is less than or equal to the height of the columnar electrode assembly.

3. The pressure sensing device according to claim 2, wherein the material of the at least one annular insulating layer includes a first elastic insulating material, and the material of the at least one columnar insulating layer includes a second elastic insulating material.

4. The pressure sensing device according to claim 1, wherein a number of the at least one annular electrode is the same as a number of the at least one columnar electrode; and
    a number of the at least one annular insulating layer is the same as a number of the at least one columnar insulating layer.

5. The pressure sensing device according to claim 4, wherein the at least one annular electrode includes a plurality of annular electrodes, a number of the plurality of annular electrodes is one more than the number of the at least one annular insulating layer, and each annular insulating layer is disposed between two adjacent annular electrodes; and the at least one columnar electrode includes a plurality of columnar electrodes, a number of the plurality of columnar electrodes is one more than the number of the at least one columnar insulating layer, and each columnar insulating layer is disposed between two adjacent columnar electrodes; or
    the at least one annular insulating layer includes a plurality of annular insulating layers, a number of the plurality of annular insulating layers is one more than the number of the at least one annular electrode, and each annular electrode is disposed between two adjacent annular insulating layers; and the at least one columnar insulating layer includes a plurality of columnar insulating layers, a number of the plurality of columnar insulating layers is one more than the number of the at least one columnar electrode, and each columnar electrode is disposed between two adjacent columnar insulating layers.

6. The pressure sensing device according to claim 5, wherein the at least one annular electrode includes three annular electrodes, and the at least one columnar electrode includes three columnar electrodes.

7. The pressure sensing device according to claim 1, further comprising:
    a connection portion, wherein the connection portion includes a base, at least one first connection terminal and at least one second connection terminal, the base includes a plurality of via holes extending through the base in a thickness direction of the base, and each first connection terminal and each second connection terminal passes through respective via holes, and protrudes from two surfaces of the base in the thickness direction thereof;
    at least one first connection wire, wherein each first connection wire electrically connects a corresponding annular electrode to a corresponding first connection terminal; and
    at least one second connection wire, wherein each second connection wire electrically connects a corresponding columnar electrode to a corresponding second connection terminal.

8. The pressure sensing device according to claim 1, further comprising:
    an insulating plate; and
    at least one spring member disposed between the insulating plate and the columnar electrode assembly, wherein an end of each spring member is fixed on the insulating plate, and an opposite end of the spring member is fixed on a side face of the columnar electrode assembly.

9. The pressure sensing device according to claim 1, wherein the columnar electrode assembly and the annular electrode assembly are arranged coaxially.

10. A display panel, comprising:
    a base substrate;
    a plurality of light-emitting devices disposed on the base substrate; and
    a plurality of pressure sensing devices according to claim 1 disposed on the base substrate, wherein each pressure sensing device is disposed between two adjacent light-emitting devices.

11. The display panel according to claim 10, further comprising:
    a plurality of pixel driving circuits disposed on the base substrate, wherein each pixel driving circuit is disposed between the base substrate and a corresponding light-emitting device, and the pixel driving circuit is configured to drive the corresponding light-emitting device to emit light;
    a plurality of driving signal lines disposed on the base substrate, wherein the plurality of driving signal lines are divided into a plurality of driving signal line groups, each driving signal line group includes at least one driving signal line, each driving signal line group is disposed between the base substrate and a corresponding pressure sensing device, and the driving signal line group is configured to supply a driving signal to the pressure sensing device; and a plurality of sensing signal lines disposed on the base substrate, wherein the plurality of sensing signal lines are divided into a plurality of sensing signal line groups, each sensing signal line group includes at least one sensing signal line, each sensing signal line group is disposed between the base substrate and a corresponding pressure sensing device, and the sensing signal line group is configured to receive a pressure sensing signal from the pressure sensing device.

12. The display panel according to claim 11, wherein the plurality of light-emitting devices include micro light-emitting diodes; and the display panel further comprising:

a planarization layer disposed between layers where the plurality of pixel driving circuits, the plurality of driving signal lines and the plurality of sensing signal lines are located and layers where the plurality of light-emitting devices and the plurality of pressure sensing devices are located, wherein a plurality of first via holes and a plurality of second via holes are formed in the planarization layer;

a plurality of first lead-out structures, wherein the pixel driving circuit includes a plurality of thin film transistors and a supply electrode; each first lead-out structure includes a first conductive pillar and a second conductive pillar, one end of the first conductive pillar is electrically connected to one of the plurality of thin film transistors through a corresponding first via hole, and an opposite end of the first conductive pillar protrudes from a surface of the planarization layer facing away from the plurality of thin film transistors to form a first contact; one end of the second conductive pillar is electrically connected to the supply electrode through another first via hole, and an opposite end of the second conductive pillar protrudes from the surface of the planarization layer facing away from the plurality of thin film transistors to form another first contact; and a plurality of second lead-out structures, wherein each second lead-out structure includes at least one third conductive pillar and at least one fourth conductive pillar, one end of each third conductive pillar is electrically connected to a corresponding driving signal line through a corresponding second via hole, an opposite end of the third conductive pillar protrudes from the surface of the planarization layer facing away from the plurality of thin film transistors to form a second contact; one end of each fourth conductive pillar is electrically connected to a corresponding sensing signal line through another second via hole, and an opposite end of the fourth conductive pillar protrudes from the surface of the planarization layer facing away from the plurality of thin film transistors to form another second contact.

13. The display panel according to claim 10, further comprising:

an elastic filling layer disposed at a side of the plurality of light-emitting devices and the plurality of pressure sensing devices away from the base substrate; and a flexible cover plate disposed on a surface of the elastic filling layer facing away from the base substrate.

14. The display panel according to claim 10, wherein the base substrate includes a first flexible substrate layer, a bonding layer, a second flexible substrate layer and a buffer layer that are stacked, and the first flexible substrate layer and the second flexible substrate layer are bonded through the bonding layer; and the plurality of light-emitting devices and the plurality of pressure sensing devices are disposed at a side of the buffer layer away from the first flexible substrate layer.

15. A display device, comprising the display panel according to claim 10.

16. A method of manufacturing a display panel, comprising:

providing a base substrate;

forming a plurality of light-emitting devices on the base substrate by a micro-transfer printing process, the plurality of light-emitting devices being spaced apart from each other;

forming a plurality of pressure sensing devices according to claim 1 on the base substrate by the micro-transfer printing process, so that each pressure sensing device is disposed between two adjacent light-emitting devices.

17. The method according to claim 16, further comprising:

forming an elastic filling layer and a flexible cover plate sequentially on the base substrate on which the plurality of light-emitting devices and the plurality of pressure sensing devices have been formed.

18. The method according to claim 16, wherein before forming the plurality of light-emitting devices and the plurality of pressure sensing devices, the method further comprises:

forming a plurality of pixel driving circuits, a plurality of driving signal lines and a plurality of sensing signal lines on the base substrate, each pixel driving circuit including a plurality of thin film transistors and a supply electrode;

forming a planarization layer having a plurality of first via holes and a plurality of second via holes on the plurality of pixel driving circuits, the plurality of driving signal lines and the plurality of sensing signal lines;

forming a plurality of first lead-out structures and a plurality of second lead-out structures on the planarization layer, wherein each first lead-out structure includes a first conductive pillar and a second conductive pillar, one end of the first conductive pillar is electrically connected to one of the plurality of thin film transistors through a corresponding first via hole, and an opposite end of the first conductive pillar protrudes from a surface of the planarization layer facing away from the plurality of thin film transistors to form a first contact; one end of the second conductive pillar is electrically connected to the supply electrode through another first via hole, and an opposite end of the second conductive pillar protrudes from the surface of the planarization layer facing away from the plurality of thin film transistors to form another first contact; and each second lead-out structure includes at least one third conductive pillar and at least one fourth conductive pillar, one end of each third conductive pillar is electrically connected to a corresponding driving signal line through a corresponding second via hole, an opposite end of the third conductive pillar protrudes from the surface of the planarization layer facing away from the plurality of thin film transistors to form a second contact; one end of each fourth conductive pillar is electrically connected to a corresponding sensing signal line through another second via hole, and an opposite end of the fourth conductive pillar protrudes from the surface of the planarization layer facing away from the plurality of thin film transistors to form another second contact.

\* \* \* \* \*